(12) United States Patent
Higuchi

(10) Patent No.: US 6,344,677 B2
(45) Date of Patent: *Feb. 5, 2002

(54) SEMICONDUCTOR DEVICE COMPRISING MIS FIELD-EFFECT TRANSISTOR, AND METHOD OF FABRICATING THE SAME

(75) Inventor: Toshihiko Higuchi, Yamanashi-ken (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/094,987

(22) Filed: Jun. 15, 1998

(30) Foreign Application Priority Data

Jun. 17, 1997 (JP) .................................... 9-160151
May 19, 1998 (JP) .................................. 10-153795

(51) Int. Cl.[7] .................................... H01L 29/78
(52) U.S. Cl. ............................. 257/408; 257/344
(58) Field of Search .................... 257/408, 344; 438/303, 595

(56) References Cited

U.S. PATENT DOCUMENTS 5,789,780 * 8/1998 Fulford, Jr. et al. .
5,793,089 * 8/1998 Fulford, Jr. et al. .
5,808,347 * 9/1998 Kurimoto et al. .
5,847,428 * 12/1998 Fulford, Jr. et al. .
5,880,500 * 3/1999 Iwata et al. .
5,929,483 * 7/1999 Kim et al. .

FOREIGN PATENT DOCUMENTS

A-2-3934    1/1990  (JP) .
A-6-260495  9/1994  (JP) .
A-9-162402  6/1997  (JP) .

* cited by examiner

Primary Examiner—George Fourson
Assistant Examiner—Joannie Adelle Garcia
(74) Attorney, Agent, or Firm—Oliff & Berridge, PLC

(57) ABSTRACT

An objective of the present invention is to provide a method of fabricating a semiconductor device comprising a MIS field-effect transistor that makes it possible to prevent damage to edge portions of a gate oxide layer during ion implantation and also prevents the thickness of edge portions of a titanium silicide layer from becoming too great.

Before n⁻-type regions 16 are formed, a silicon nitride layer 24 is formed to extend from corner portions 42 of a gate electrode 26 and over side surfaces of a gate oxide layer 20. Ion implantation is used to form the n⁻-type regions 16. The silicon nitride layer 24 has been positioned so as to shield the side surfaces of the gate oxide layer 20. This ensures that ions do not strike the side surfaces of the gate oxide layer 20 during the implantation. When a titanium silicide layer 28 is formed on the upper surface of the gate electrode 26, the silicide reaction of the silicon nitride layer 24 on the side surfaces of the gate electrode 26 is prevented.

18 Claims, 23 Drawing Sheets

SEMICONDUCTOR DEVICE COMPRISING MIS FIELD-EFFECT TRANSISTOR, AND METHOD OF FABRICATING THE SAME

BACKGROUND OF THE INVENTION

1. Field of the Invention

The present invention relates to a method of fabricating a semiconductor device comprising a MIS field-effect transistor and a semiconductor device comprising a MIS field-effect transistor that is fabricated by that method.

2. Description of Related Art

Various methods of fabricating a metal-insulator semiconductor (MIS) field-effect transistor have been disclosed, such as that in Japanese Patent Application Laid-Open No. 9-162402, for example. The method of fabricating an MIS field-effect transistor disclosed in that document will be descried below.

A p-type well 202 is formed on the main surface of a p-type silicon substrate 200, as shown in FIG. 40. A field oxide layer 204 is formed around the p-type well 202, to separate the elements. A gate oxide layer 206 is formed on the p-type well 202. A polysilicon layer 208 is formed on the gate oxide layer 206.

The polysilicon layer 208 is etched selectively to form a gate electrode 212, as shown in FIG. 41. The gate electrode 212 and the field oxide layer 204 are used as a mask for the implantation of ions of arsenic into the main surface of the silicon substrate 200, to form $n^-$-type regions 214. A chemical vapor deposition (CVD) method is then used to form a silicon nitride layer 210 on the main surface of the silicon substrate 200 in such a manner as to cover the gate electrode 212. Anisotropic etching is used to etch back this silicon nitride layer 210 so that the remaining silicon nitride layer 210 has a thickness of 10 nm and shields the side surfaces of the gate electrode 212 and the side surfaces of the gate oxide layer 206. The formation of the silicon nitride layer 210 at positions shielding the side surfaces of the gate oxide layer 206 ensures that the supply of oxygen to the gate oxide layer 206 is prevented. This prevents the occurrence of "bird's beak" in the gate oxide layer 206 of the gate. Gate bird's beak is a cause of deterioration of the characteristics of the MIS field-effect transistor. The thickness of the silicon nitride layer 210 is set to 10 nm for reasons given below. A source/drain of the resultant MIS field-effect transistor consists of three regions: an $n^-$-type region, an n-type region, and an n+-type region. The $n^-$-type region is positioned below the silicon nitride layer 210. If the thickness of the silicon nitride layer 210 is less than 10 nm, the width of the $n^-$-type region is also less than 10 nm. If the width of the $n^-$-type region is less than 10 nm, the n-type region becomes absorbed into the neighboring n-type region and it can no longer function as an $n^-$-type region.

The gate electrode 212, the silicon nitride layer 210, and the field oxide layer 204 are used as a mask for the implantation of arsenic ions into the main surface of the silicon substrate 200, to form n-type regions 218 as shown in FIG. 42. A silicon oxide layer is then formed on the main surface of the silicon substrate 200 by a CVD method, to cover the gate electrode 212. This silicon oxide layer is etched back by using anisotropic etching to form a side-wall silicon oxide layer 216 in such a manner that it shields the silicon nitride layer 210.

The gate electrode 212, the silicon nitride layer 210, the side-wall silicon oxide layer 216, and the field oxide layer 204 are used as a mask for the implantation of arsenic ions into the main surface of the silicon substrate 200, to form $n^+$-type regions 220 as shown in FIG. 43.

An intermediary insulation layer 222 is formed over the entire surface of the silicon substrate 200 so as to cover the gate electrode 212, as shown in FIG. 44. Contact holes 224 are formed in the intermediary insulation layer 222 to reach the $n^+$-type regions 220. A conductive layer is formed on top of the intermediary insulation layer 222 and within the contact holes 224. A wiring layer 226 is formed by subjecting this conductive layer to given patterning. The MIS field-effect transistor is fabricated by the above steps.

Referring back to FIG. 41, the $n^-$-type regions 214 are formed by the implantation of ions into the main surface of the silicon substrate 200, using the gate electrode 212 as a mask. The side surfaces of the gate oxide layer 206 are exposed during this ion implantation. Since the side surfaces of the gate oxide layer 206 are exposed, ions strike the side surfaces of the gate oxide layer 206. This results in places at edge portions of the gate oxide layer 206 where the bonding of the crystalline structure of the gate oxide layer are broken. There are three main problems caused by breakage of the bonding of the crystalline structure in the gate oxide layer: the dielectric breakdown voltage drops at the places in the gate insulation layer where the crystalline structure is damaged, so the dielectric breakdown voltage of the entire gate insulation layer drops; carriers flow through the places in the gate insulation layer where the crystalline structure is damaged, causing a leakage current through the gate insulation layer; and carriers flowing through the channel can easily be trapped at the places in the gate insulation layer where the crystalline structure is damaged. These all change the characteristics of the MIS field-effect transistor. The long-term reliability of the MIS field-effect transistor also falls.

If tilted ion implantation 258 in particular is used to form a source/drain 254, as shown in FIG. 45, a large number of ions will strike the side surfaces of the gate oxide layer 206 directly. This makes it more likely for large numbers of places where the bonding of the crystalline structure are broken to appear in the edge portions of the gate oxide layer 206. The reasons for using tilted ion implantation will now be discussed. If this tilted ion implantation 258 is used to create the source/drain 254, edge portions 256 of the source/drain 254 are formed at positions overlapping the gate electrode 212. This will prevent carriers that are flowing through the channel from jumping into the gate oxide layer 206. In other words, if a side surface of one of the $n^-$-type regions 214 of the source or drain is positioned directly below a side surface of the gate electrode 212, concentrations in electrical field will occur at the places indicated by arrows A. These electrical field concentrations make it easy for the carriers flowing in the channel to jump into the gate oxide layer 206. If carriers jump into the gate oxide layer 206, the characteristics of the gate oxide layer 206 will deteriorate.

Note that the $n^-$-type regions 214 shown in FIG. 41 could also be formed by diffusion. The side surfaces of the gate oxide layer 206 will still be exposed, even when the $n^-$-type regions 214 are formed by diffusion. This means that the diffused impurity will go through the side surfaces of the gate oxide layer 206 into the crystalline structure of the gate oxide layer 206. This will cause the dielectric breakdown voltage of the gate oxide layer 206 to drop.

With the fabrication of a MIS field-effect transistor, a silicide layer is often formed on the upper surface of the gate electrode, to lower the electrical resistance of the gate electrode. This is discussed below.

A p-type well 232 is formed in a main surface of a p-type silicon substrate 230, as shown in FIG. 46. A field oxide layer 234 is formed around the p-type well 232. A gate oxide layer 236 and a polysilicon layer are then formed on the main surface of the silicon substrate 230. A gate electrode 238 is then formed by subjecting the polysilicon layer to given patterning. The gate electrode 238 and the field oxide layer 234 are used as a mask for the implantations of ions into the main surface of the silicon substrate 230, to form n⁻-type regions 242. A silicon oxide layer is then formed on the main surface of the silicon substrate 230 so as to cover the gate electrode 238. This silicon oxide layer is etched back by anisotropic etching to form a side-wall silicon oxide layer 240 that shields the side surfaces of the gate electrode 238 and the gate oxide layer 236. For example, the side-wall silicon oxide layer 240 is over-etched to ensure that none of the silicon oxide layer remains at stepped portions, such as that indicated by A in the FIG. 46. This means that the remaining side-wall silicon oxide layer 240 is positioned lower than corner portions 260 formed by side surfaces and the upper surface of the gate electrode 238. The gate electrode 238, the side-wall silicon oxide layer 240, and the field oxide layer 234 are then used as a mask for the implantation of ions into the main surface of the silicon substrate 230, to form n⁺-type regions 244.

Using a method such as sputtering, a titanium layer 246 is formed over the entire main surface of the silicon substrate 230, as shown in FIG. 47.

The titanium layer 246 is subjected to thermal treatment to cause the titanium layer that is positioned on top of the upper surface of the gate electrode 238 and above the n⁺-type regions 244 to react with the silicon and thus form titanium silicide layers 248 and 250, as shown in FIG. 48. The side surfaces of the gate electrode 238 are exposed at the corner portions 260 of the gate electrode 238. This means that silicon is supplied to the titanium layer from these portions as well, during the formation of the titanium silicide layer. The result of supplying silicon from the upper and side surfaces of the gate electrode 238 at the corner portions 260 of the gate electrode 238 is an excess of silicon reacting with the titanium layer, so that the thickness of edge portions 262 of the resultant titanium suicide layer 248 is greater than that of a central portion 263 thereof.

The unreacted titanium layer on top of the field oxide layer 234 and the side-wall silicon oxide layer 240 is removed, as shown in FIG. 49.

Using a method such as CVD, an intermediary insulation layer 252 is then formed over the entire main surface of the silicon substrate 230, as shown in FIG. 50. Protuberant portions 266 are inevitably formed in the intermediary insulation layer 252, to reflect the increased thickness of the edge portions 262 of the titanium silicide layer 248. When the gate electrode pattern and the wiring pattern become finer in the future, it is possible that the wiring layer will break if it is formed on top of such protuberant portions 266. If the silicide layer is too thick, furthermore, the thermal stresses generated in the silicide layer will also be greater than when the film is thinner. If the thickness of the edge portions of the silicide layer increases, the thermal stresses in those portions of the suicide layer will increase. This means that the thermal stresses imposed on the gate insulation layer from the silicide layer will also increase. This will lead to changes in the characteristics of the MIS field-effect transistor and a deterioration in its long-term reliability.

Problems will occur even if the side-wall silicon oxide layer 240 is not over-etched, as discussed below. Assume that the side-wall silicon oxide layer 240 is not over-etched, as shown in FIG. 51. This means that the side-wall silicon oxide layer 240 is formed in such a manner that it extends as far as a position facing the corner portions 260.

The gate electrode 238, the side-wall silicon oxide layer 240, and the field oxide layer 234 are used as a mask to implant ions into the main surface of the silicon substrate 230, to form the n⁺-type regions 244 as shown in FIG. 52. Sputtering is then used to form the titanium layer 246 over the entire main surface of the silicon substrate 230, so as to cover the gate electrode 238.

The titanium layer is subjected to thermal treatment to form the titanium silicide layers 248 and 250 on top of the upper surface of the gate electrode 238 and the n⁺-type regions 244, as shown in FIG. 53. The unreacted titanium layer that is positioned on top of the field oxide layer 234 and the side-wall silicon oxide layer 240 is then removed. The side-wall silicon oxide layer 240 is thus formed as far as a position corresponding to the corner portions 260 of the gate electrode 238. Thus the side surfaces of the gate electrode 238 are not exposed in the vicinity of the corner portions 260 of the gate electrode 238. This means that no silicon is supplied from the side surfaces of the gate electrode 238 in the vicinity of the corner portions 260, and thus the titanium layer does not react excessively with silicon at the corner portions 260. For that reason, the thickness of the edge portions of the titanium silicide layer 248 is not greater than the thickness of the central portion thereof. This prevents the problem of the creation of protuberant portions in the intermediary insulation layer, caused by increased thickness at the edge portions of the titanium silicide layer 248. However, other problems occur, as discussed below.

A partial plan view of the structure of FIG. 53 is shown in FIG. 54. Silicon comprised within the side-wall silicon oxide layer 240 links with the titanium layer, with the result that titanium silicide is formed in various places on the surface of the side-wall silicon oxide layer 240. Of this titanium silicide, links are created with the titanium silicide formed in the titanium suicide layer 248 and the side-wall silicon oxide layer 240, at the boundary between the titanium silicide layer 248 and the side-wall silicon oxide layer 240. As a result, the side portions of the titanium silicide layer 248 have a jagged form. For the same reason, side portions of a titanium silicide layer 250 also have a jagged form. Electrostatic charges can readily short-circuit at the points of this jagged form, which may cause deterioration in the characteristics of the MIS field-effect transistor.

SUMMARY OF THE INVENTION

The present invention was devised in order to solve the above described technical problems. The present invention addresses the above technical problems by providing a method of fabricating a semiconductor device comprising a MIS field-effect transistor having a lightly doped drain (LDD) structure, in which the edge portions of the gate insulation layer are not damaged, as well as a semiconductor device comprising a MIS field-effect transistor that is fabricated by this method.

Another technical problem is addressed by the present invention by providing a method of fabricating a semiconductor device comprising a MIS field-effect transistor whereby the thickness of edge portions of a silicide layer can be made the same as the thickness of a central portion thereof during the formation of the suicide layer on a gate electrode, as well as a semiconductor device comprising a MIS field-effect transistor that is fabricated by this method.

A yet further technical problem is addressed by the present invention by providing a method of fabricating a semiconductor device comprising a MIS field-effect transistor whereby edge portions of the silicide layer can be prevented from adopting a jagged form, as well as a semiconductor device comprising a MIS field-effect transistor that is fabricated by this method.

A first aspect of the method of fabricating a semiconductor device comprising a MIS field-effect transistor in accordance with the present invention relates to a method of fabricating a semiconductor device comprising a MIS field-effect transistor, the MIS field-effect transistor including:

- a semiconductor substrate having a main surface;
- a gate insulation layer formed on the main surface and having a side surface;
- a gate electrode formed on the gate insulation layer and having a corner portion between a side surface and an upper surface thereof; and
- a pair of source/drain having a low-density impurity region and a high-density impurity region formed in the main surface.

This method comprises:

- a step of forming the gate insulation layer and the gate electrode on the main surface;
- a step of forming a protection layer for gate insulation layer comprising at least one of a silicon nitride film, a non-doped polysilicon film, and a non-doped amorphous silicon film, the protection layer for gate insulation layer being formed so as to shield the side surface of the gate insulation layer;
- a step of forming a side-wall insulation layer comprising an impurity, in such a manner that the protection layer for gate insulation layer is sandwiched between the side-wall insulation layer and the side surface of the gate electrode; and
- a step of forming the high-density impurity region in the main surface, then diffusing the impurity within the side-wall insulation layer by thermal diffusion into the main surface below the side-wall insulation layer to form the low-density impurity region in the main surface.

In this first aspect of the method of fabricating a semiconductor device comprising a MIS field-effect transistor in accordance with the present invention, the protection layer for gate insulation layer is formed before the low-density impurity region is formed. During the diffusion of the impurity within the side-wall insulation layer into the main surface below the side-wall insulation layer by thermal diffusion, the impurity is prevented from passing through the side surface of the gate insulation layer and diffusing into the edge portions of the gate insulation layer. This is because the film quality of the silicon nitride film, non-doped polysilicon film, or non-doped amorphous silicon film forming the protection layer for gate insulation layer is extremely fine, so that it is difficult for the impurity to pass through the protection layer for gate insulation layer. Since it is also difficult for moisture or oxygen to pass through such films, it is possible to prevent moisture and oxygen from damaging the edge portions of the gate insulation layer. Of these three types of film, a silicon nitride film is the most effective. In addition, it is harder to etch silicon nitride film than to etch silicon oxide film.

As previously described, the first aspect of the method of fabricating a semiconductor device comprising a MIS field-effect transistor in accordance with the present invention makes it possible to prevent damage to the gate insulation layer caused by factors such as impurities, moisture, and oxygen. It is therefore possible to prevent changes in the characteristics of the semiconductor device comprising a MIS field-effect transistor and deterioration of the long-term reliability thereof, caused by damage to the gate insulation layer.

In a preferred configuration of the first aspect of the method of fabricating a semiconductor device comprising a MIS field-effect transistor in accordance with the present invention, the step of forming the protection layer for gate insulation layer comprises:

- a step of forming a film that will become the protection layer for gate insulation layer on the main surface, so as to cover the gate insulation layer and the gate electrode; and
- a step of anisotropically etching the film to form the protection layer for gate insulation layer so as to shield the side surface of the gate electrode and the side surface of the gate insulation layer from a position corresponding to the corner portion and over positions corresponding to the side surface of the gate insulation layer.

In another preferred configuration of the first aspect of the method of fabricating a semiconductor device comprising a MIS field-effect transistor in accordance with the present invention, the step of forming a side-wall insulation layer comprises a step of forming the side-wall insulation layer so as to extend as far as a position corresponding to the corner portion.

In yet another preferred configuration of the first aspect of the method of fabricating a semiconductor device comprising a MIS field-effect transistor in accordance with the present invention, the step of forming a side-wall insulation layer comprises a step of over-etching the side-wall insulation layer to form the side-wall insulation layer to be positioned lower than the corner portion.

In still another preferred configuration of the first aspect of the method of fabricating a semiconductor device comprising a MIS field-effect transistor in accordance with the present invention, after the step of forming the low-density impurity region and the high-density impurity region, the method further comprises: a step of forming a refractory metal layer so as to cover the side-wall insulation layer and the gate electrode; and a step of thermal treating the refractory metal layer to form a silicide layer on the upper surface of the gate electrode. When this aspect of the invention is combined with a step of forming the protection layer for gate insulation layer so as to shield the side surface of the gate electrode and the side surface of the gate insulation layer from a position corresponding to the corner portion of the gate electrode and over positions corresponding to the side surface of the gate insulation layer, a protection layer for gate insulation layer can be formed between the silicide layer and the side-wall insulation layer. The presence of this protection layer for gate insulation layer makes it possible to prevent the occurrence of jagged portions in the boundary surface between the silicide layer and the side-wall insulation layer. It is therefore possible to prevent deterioration in the characteristics of the semiconductor device comprising a MIS field-effect transistor, caused by short-circuiting of electrostatic charges at such jagged portions.

When this aspect of the invention is combined with a step of forming the protection layer for gate insulation layer so as to shield the side surface of the gate electrode and the side surface of the gate insulation layer from a position corresponding to the corner portion of the gate electrode and over positions corresponding to the side surface of the gate insulation layer, and also with a step of over-etching the side-wall insulation layer to form the side-wall insulation layer so that it is positioned lower than the corner portion, the thickness of the edge portions of the silicide layer will not become greater than the thickness of the central portion thereof. This is because the presence of the protection layer for gate insulation layer at a position corresponding to the corner portion of the gate electrode will ensure that the refractory metal layer does not form the silicide at the side surface of the gate electrode during the formation of the silicide layer. Thermal stresses in the silicide layer are greater when the thickness thereof is large comparing with when the thickness is small . This configuration ensures that the thickness of the edge portions of the silicide layer can be made smaller, so that the thermal stresses generated in the silicide layer can be reduced. This makes it possible to reduce the thermal stresses given to the gate insulation layer from the silicide layer. It is therefore possible to prevent changes in the characteristics of the semiconductor device comprising a MIS field-effect transistor and deterioration of the long-term reliability thereof.

In addition, since the thickness of the edge portions of the silicide layer is substantially the same as the thickness of the central portion thereof, the silicide layer is flat. This is reflected in the intermediary insulation layer positioned above the silicide layer, to be also flat. This makes it possible to avoid problems such as breaks in the wires of the wiring layer when the wiring layer is formed on top of the intermediary insulation layer positioned above the silicide layer.

The refractory metal layer preferably comprises at least one metal selected from the group of: titanium, cobalt, molybdenum, platinum, nickel, and tungsten.

In a further preferred configuration of the first aspect of the method of fabricating a semiconductor device comprising a MIS field-effect transistor in accordance with the present invention, the refractory metal layer comprises titanium. The step of forming the silicide layer may comprise:

a step of thermal treating the refractory metal layer to form a titanium silicide layer on the upper surface of the gate electrode;

a step of removing the refractory metal layer on the side-wall insulation layer; and a step of thermal treating the titanium silicide layer to lower the resistance of the titanium silicide layer.

The refractory metal layer preferably comprises titanium. The initial thermal treatment ensures that the crystalline structure of the titanium silicide layer is C49. During this time, thermal stresses occur in the titanium silicide layer. These thermal stresses have an adverse effect on the gate insulation layer. The subsequent thermal treatment ensures that the crystalline structure of the silicide layer becomes C54. This processing is used because a C54 titanium silicide layer has a lower electrical resistance than a C49 titanium silicide layer. During this processing too, thermal stresses occur in the titanium silicide layer. Thus the gate insulation layer experiences thermal stresses twice. Since the thickness of the edge portions of the titanium silicide layer can be made smaller with this configuration, the thermal stresses experienced twice by the gate insulation layer can be reduced.

In a still further preferred configuration of the first aspect of the method of fabricating a semiconductor device comprising a MIS field-effect transistor in accordance with the present invention, the method further comprises a step of forming an oxide insulation layer by thermal oxidation so as to cover the side surface of the gate insulation layer and the side surface of the gate electrode, between the step of forming the gate electrode and the step of forming the protection layer for gate insulation layer.

Since the protection layer for gate insulation layer has a dielectric constant that is higher than that of the oxide insulation layer, very small currents can easily flow in the surfaces thereof. Thus, if the protection layer for gate insulation layer is in direct contact with the gate electrode, the parasitic capacitance of the gate electrode will become large. This impedes the high speed operation of a semiconductor device comprising such a MIS field-effect transistor. In addition, a leakage current is generated from the gate electrode, through the protection layer for gate insulation layer, to the semiconductor substrate. This leakage current causes an increase in the current consumption of a semiconductor device comprising such a MIS field-effect transistor. With this configuration, the oxide insulation layer is formed so as to cover the side surface of the gate insulation layer and the side surface of the gate electrode, so these problems can be solved. Note that if the gate electrode is formed of polysilicon or a silicide, the oxide insulation layer will be a silicon oxide layer.

Note also that if the oxide insulation layer is formed in such a manner that the thickness thereof is less than the thickness of the gate insulation layer, and it extends as far as on the low-density impurity region, the protection layer for gate insulation layer will be positioned above the oxide insulation layer above the low-density impurity region. Thus the protection layer for gate insulation layer is not formed so as to shield the entire side surface of the gate insulation layer, but to shield only part of that side surface. Even in this case too, it has a protective effect on the gate insulation layer. It should be noted, however, that the protective effect on the gate insulation layer is greater when the protection layer for gate insulation layer is formed so as to shield the entire side surface of the gate insulation layer.

In the first aspect of the method of fabricating a semiconductor device comprising a MIS field-effect transistor in accordance with the present invention, the side-wall insulation layer comprises a silicon oxide layer, and the impurity therein is preferably at least one of phosphorus and boron.

A second aspect of the method of fabricating a semiconductor device comprising a MIS field-effect transistor in accordance with the present invention relates to a method of fabricating a semiconductor device comprising a MIS field-effect transistor, the MIS field-effect transistor including:

a semiconductor substrate having a main surface;

a gate insulation layer formed on the main surface and having a side surface;

a gate electrode formed on the gate insulation layer and having a corner portion between a side surface and an upper surface thereof; and a pair of source/drain having a low-density impurity region and a high-density impurity region formed in the main surface.

This method comprises:

a step of forming the gate insulation layer and the gate electrode on the main surface;

a step of forming a protection layer for gate insulation layer comprising at least one of a silicon nitride film, a non-doped polysilicon film, and a non-doped amorphous silicon film, the protection layer for gate insulation layer being formed so as to shield the side surface of the gate insulation layer;

a step of forming the low-density impurity region in the main surface;

a step of forming a side-wall insulation layer in such a manner that the protection layer for gate insulation layer is sandwiched between the side-wall insulation layer and the side surface of the gate electrode; and a step of forming the high-density impurity region in the main surface.

In this second aspect of the method of fabricating a semiconductor device comprising a MIS field-effect transistor in accordance with the present invention, the protection layer for gate insulation layer is formed before the low-density impurity region is formed. When the low-density impurity region is formed by thermal diffusion or ion implantation, the impurity or ions can be prevented from penetrating the edge portion of the gate insulation layer through the side surface of the gate insulation layer. This is because the film quality of the silicon nitride film, non-doped polysilicon film, or non-doped amorphous silicon film forming the protection layer for gate insulation layer is extremely fine, so that it is difficult for the impurity or ions to pass through the protection layer for gate insulation layer. Since it is also difficult for moisture or oxygen to pass through such films, it is possible to prevent moisture and oxygen from damaging the edge portions of the gate insulation layer. Of these three types of film, a silicon nitride film is the most effective. In addition, it is harder to etch silicon nitride film than to etch silicon oxide film.

As previously described, the second aspect of the method of fabricating a semiconductor device comprising a MIS field-effect transistor in accordance with the present invention makes it possible to prevent damage to the gate insulation layer due to causes such as impurities, ions, moisture, and oxygen. It is therefore possible to prevent changes in the characteristics of the semiconductor device comprising a MIS field-effect transistor and deterioration of the long-term reliability thereof, caused by damage to the gate insulation layer.

In a preferred configuration of the second aspect of the method of fabricating a semiconductor device comprising a MIS field-effect transistor in accordance with the present invention, the step of forming the protection layer for gate insulation layer comprises:

a step of forming a film that will become the protection layer for gate insulation layer on the main surface, so as to cover the gate insulation layer and the gate electrode; and a step of anisotropically etching the film to form the protection layer for gate insulation layer so as to shield the side surface of the gate electrode and the side surface of the gate insulation layer from a position corresponding to the corner portion and over positions corresponding to the side surface of the gate insulation layer.

In another preferred configuration of the second aspect of the method of fabricating a semiconductor device comprising a MIS field-effect transistor in accordance with the present invention, the step of forming a side-wall insulation layer comprises a step of forming the side-wall insulation layer so as to extend as far as a position corresponding to the corner portion.

In still another preferred configuration of the second aspect of the method of fabricating a semiconductor device comprising a MIS field-effect transistor in accordance with the present invention, the step of forming a side-wall insulation layer comprises a step of over-etching the side-wall insulation layer to form the side-wall insulation layer to be positioned lower than the corner portion.

In yet another preferred configuration of the second aspect of the method of fabricating a semiconductor device comprising a MIS field-effect transistor in accordance with the present invention, after the step of forming the high-density impurity region, the method further comprises:

a step of forming a refractory metal layer so as to cover the side-wall insulation layer and the gate electrode; and a step of thermal treating the refractory metal layer to form a silicide layer on the upper surface of the gate electrode.

When this aspect of the invention is combined with a step of forming the protection layer for gate insulation layer so as to shield the side surface of the gate electrode and the side surface of the gate insulation layer from a position corresponding to the corner portion of the gate electrode and over positions corresponding to the side surface of the gate insulation layer, the protection layer for gate insulation layer can be formed between the silicide layer and the side-wall insulation layer. The presence of this protection layer for gate insulation layer makes it possible to prevent the occurrence of jagged portions in the boundary surface between the silicide layer and the side-wall insulation layer.

When this aspect of the invention is combined with a step of forming the protection layer for gate insulation layer so as to shield the side surface of the gate electrode and the side surface of the gate insulation layer from a position corresponding to the corner portion of the gate electrode and over positions corresponding to the side surface of the gate insulation layer, and a step of over-etching the side-wall insulation layer to form the side-wall insulation layer so that it is positioned lower than the corner portion, the thickness of the edge portions of the silicide layer will not become greater than the thickness of the central portion thereof. This is because the presence of the protection layer for gate insulation layer at a position corresponding to the corner portion of the gate electrode will ensure that the refractory metal layer does not form the silicide at the side surface of the gate electrode during the formation of the silicide layer. Thermal stresses in the silicide layer are greater when the thickness thereof is large comparing with when the thickness is small. This configuration ensures that the thickness of the edge portions of the silicide layer can be made smaller, so that the thermal stresses generated in the silicide layer can be reduced. This makes it possible to reduce the thermal stresses given to the gate insulation layer from the silicide layer.

In addition, since the thickness of the edge portions of the silicide layer is the same as the thickness of the central portion thereof, the silicide layer is flat. This is reflected in the intermediary insulation layer positioned above the silicide layer, to be also flat. This makes it possible to avoid problems such as breaks in the wires of the wiring layer when the wiring layer is formed on top of the intermediary insulation layer positioned above the silicide layer.

The refractory metal layer preferably comprises at least one metal selected from the group of: titanium, cobalt, molybdenum, platinum, nickel, and tungsten.

In a further preferred configuration of the second aspect of the method of fabricating a semiconductor device comprising a MIS field-effect transistor in accordance with the present invention, the refractory metal layer comprises titanium. The step of forming a silicide layer may comprise:

a step of thermal treating the refractory metal layer to form a titanium silicide layer on the upper surface of the gate electrode;

a step of removing the refractory metal layer on the side-wall insulation layer; and a step of thermal treating the titanium silicide layer to lower the resistance of the titanium silicide layer.

The refractory metal layer preferably comprises titanium. The initial thermal treatment ensures that the crystalline structure of the titanium silicide layer is C49. During this time, thermal stresses occur in the titanium silicide layer. These thermal stresses have an adverse effect on the gate insulation layer. The subsequent thermal treatment ensures that the crystalline structure of the suicide layer becomes C54. This processing is used because a C54 titanium silicide layer has a lower electrical resistance than a C49 titanium silicide layer. During this processing too, thermal stresses occur in the titanium silicide layer. Thus the gate insulation layer experiences thermal stresses twice. Since the thickness of the edge portions of the titanium silicide layer can be made smaller with this configuration, the thermal stresses experienced twice by the gate insulation layer can be reduced.

In a still further preferred configuration of the second aspect of the method of fabricating a semiconductor device comprising a MIS field-effect transistor in accordance with the present invention, the step of forming the low-density impurity region comprises a step of implanting ions of an impurity obliquely into the main surface. This tilted ion implantation is a method of implanting ions at a constant angle with respect to the main surface of the semiconductor substrate.

If there is no protection layer for gate insulation layer when tilted ion implantation is used to form the low-density impurity region, the ions would strike the side surface of the gate insulation layer directly. This would make it easy for a large number of breaks to occur in the crystalline structure at the edge portions of the gate insulation layer. Since this configuration provides the protection layer for gate insulation layer, the ions can be prevented from striking the side surfaces of the gate insulation layer directly.

In a yet further preferred configuration of the second aspect of the method of fabricating a semiconductor device comprising a MIS field-effect transistor in accordance with the present invention, between the step of forming the gate electrode and the step of forming the protection layer for gate insulation layer, the method further comprises a step of forming an oxide insulation layer by thermal oxidation so as to cover the side surface of the gate insulation layer and the side surface of the gate electrode.

Since the protection layer for gate insulation layer has a dielectric constant that is higher than that of the oxide insulation layer, very small currents can easily flow in the surfaces thereof. Thus, if the protection layer for gate insulation layer is in direct contact with the gate electrode, the parasitic capacitance of the gate electrode will become large. This impedes the high speed operation of a semiconductor device comprising such a MIS field-effect transistor. In addition, a leakage current is generated from the gate electrode, through the protection layer for gate insulation layer, to the semiconductor substrate. This leakage current causes an increase in the current consumption of a semiconductor device comprising such a MIS field-effect transistor. With this configuration, the oxide insulation layer is formed so as to cover the side surface of the gate insulation layer and the side surface of the gate electrode, so these problems can be solved. Note that if the gate electrode is formed of polysilicon or a silicide, the oxide insulation layer will be a silicon oxide layer.

Note also that if the oxide insulation layer is formed in such a manner that the thickness thereof is less than the thickness of the gate insulation layer, and it extends as far as on the low-density region, the protection layer for gate insulation layer will be positioned above the oxide insulation layer above the low-density impurity region. Thus the protection layer for gate insulation layer is not formed so as to shield the entire side surface of the gate insulation layer, but to shield only part of that side surface. In this case too, it has a protective effect on the gate insulation layer. It should be noted, however, that the protective effect on the gate insulation layer is greater when the protection layer for gate insulation layer is formed to shield the entire side surface of the gate insulation layer.

A third aspect of the method of fabricating a semiconductor device comprising a MIS field-effect transistor in accordance with the present invention relates to a method of fabricating a semiconductor device comprising a MIS field-effect transistor, the MIS field-effect transistor including:

a semiconductor substrate having a main surface;

a gate insulation layer formed on the main surface and having a side surface;

a gate electrode formed on the gate insulation layer and having a corner portion between a side surface and an upper surface thereof; and a pair of source/drain formed in the main surface.

This method comprises:

a step of forming the gate insulation layer and the gate electrode on the main surface;

a step of forming a protection layer for gate insulation layer comprising at least one of a silicon nitride film, a non-doped polysilicon film, and a non-doped amorphous silicon film, the protection layer for gate insulation layer being formed so as to shield the side surface of the gate insulation layer;

a step of forming a side-wall insulation layer in such a manner that the protection layer for gate insulation layer is sandwiched between the side-wall insulation layer and the side surface of the gate electrode;

a step of forming the pair of source/drain in the main surface;

a step of forming a refractory metal layer so as to cover the side-wall insulation layer and the gate electrode; and a step of thermal treating the refractory metal layer to form a silicide layer on the upper surface of the gate electrode.

In this third aspect of the method of fabricating a semiconductor device comprising a MIS field-effect transistor in accordance with the present invention, the protection layer for gate insulation layer is formed before the pair of source/drain is formed. When the pair of source/drain is formed by thermal diffusion or ion implantation, the impurity or ions can be prevented from penetrating the edge portion of the gate insulation layer through the side surface of the gate insulation layer. This is because the film quality of the silicon nitride film, non-doped polysilicon film, or non-doped amorphous silicon film forming the protection layer for gate insulation layer is extremely fine, so that it is difficult for the impurity or ions to pass through the protection layer for gate insulation layer. Since it is also difficult for moisture or oxygen to pass through such films, it is possible to prevent moisture and oxygen from damaging the edge portions of the gate insulation layer. Of these three types of film, a silicon nitride film is the most effective. In addition, it is harder to etch silicon nitride film than to etch silicon oxide film.

As previously described, the third aspect of the method of fabricating a semiconductor device comprising a MIS field-effect transistor in accordance with the present invention makes it possible to prevent damage to the gate insulation layer due to causes such as impurities, ions, moisture, and oxygen. It is therefore possible to prevent changes in the characteristics of the semiconductor device comprising a MIS field-effect transistor and deterioration of the long-term reliability thereof, caused by damage to the gate insulation layer.

In a preferred configuration of the third aspect of the method of fabricating a semiconductor device comprising a MIS field-effect transistor in accordance with the present invention, the step of forming the protection layer for gate insulation layer comprises:

a step of forming a film that will become the protection layer for gate insulation layer on the main surface, so as to cover the gate insulation layer and the gate electrode; and a step of anisotropically etching the film to form the protection layer for gate insulation layer so as to shield the side surface of the gate electrode and the side surface of the gate insulation layer from a position corresponding to the corner portion and over positions corresponding to the side surface of the gate insulation layer. With this configuration, a protection layer for gate insulation layer can be formed between the silicide layer and the side-wall insulation layer. The presence of this protection layer for gate insulation layer makes it possible to prevent the occurrence of jagged portions in the boundary surface between the silicide layer and the side-wall insulation layer.

In another preferred configuration of the third aspect of the method of fabricating a semiconductor device comprising a MIS field-effect transistor in accordance with the present invention, the step of forming a side-wall insulation layer comprises a step of forming the side-wall insulation layer so as to extend as far as a position corresponding to the corner portion.

In yet another preferred configuration of the third aspect of the method of fabricating a semiconductor device comprising a MIS field-effect transistor in accordance with the present invention, the step of forming a side-wall insulation layer comprises a step of over-etching the side-wall insulation layer to form the side-wall insulation layer to be positioned lower than the corner portion.

With this configuration, the side-wall insulation layer is over-etched but the thickness of the edge portions of the silicide layer will not become greater than the thickness of the central portion thereof. This is because the presence of the protection layer for gate insulation layer at a position corresponding to the corner portion of the gate electrode will ensure that the refractory metal layer does not form the silicide at the side surface of the gate electrode during the formation of the suicide layer. Thermal stresses in the silicide layer are greater when the thickness thereof is large comparing with when the thickness is small. This configuration ensures that the thickness of the edge portions of the silicide layer can be made smaller, so that the thermal stresses generated in the silicide layer can be reduced. This makes it possible to reduce the thermal stresses given to the gate insulation layer from the silicide layer.

In addition, since the thickness of the edge portions of the silicide layer is the same as the thickness of the central portion thereof, the silicide layer is flat. This is reflected in the intermediary insulation layer positioned above the silicide layer, to be also flat. This makes it possible to avoid problems such as breaks in the wires of the wiring layer when the wiring layer is formed on top of the intermediary insulation layer positioned above the silicide layer.

The refractory metal layer preferably comprises at least one metal selected from the group of: titanium, cobalt, molybdenum, platinum, nickel, and tungsten.

In a further preferred configuration of the third aspect of the method of fabricating a semiconductor device comprising a MIS field-effect transistor in accordance with the present invention, the refractory metal layer comprises a titanium. The step of forming the silicide layer may comprise:

a step of thermal treating the refractory metal layer to form a titanium silicide layer in the upper surface of the gate electrode;

a step of removing the refractory metal layer on the side-wall insulation layer; and a step of thermal treating the titanium silicide layer to lower the resistance of the titanium silicide layer.

The refractory metal layer preferably comprises titanium. The initial thermal treatment ensures that the crystalline structure of the titanium silicide layer is C49. During this time, thermal stresses occur in the titanium silicide layer. These thermal stresses have an adverse effect on the gate insulation layer. The subsequent thermal treatment ensures that the crystalline structure of the silicide layer becomes C54. This processing is used because a C54 titanium silicide layer has a lower electrical resistance than a C49 titanium silicide layer. During this processing too, thermal stresses occur in the titanium silicide layer. Thus the gate insulation layer experiences thermal stresses twice. Since the thickness of the edge portions of the titanium silicide layer can be made smaller with this configuration, the thermal stresses experienced twice by the gate insulation layer can be reduced.

In still another preferred configuration of the third aspect of the method of fabricating a semiconductor device comprising a MIS field-effect transistor in accordance with the present invention, between the step of forming the gate electrode and the step of forming the protection layer for gate insulation layer, the method further comprises a step of forming an oxide insulation layer by thermal oxidation so as to cover the side surface of the gate insulation layer and the side surface of the gate electrode.

Since the protection layer for gate insulation layer has a dielectric constant that is higher than that of the oxide insulation layer, very small currents can easily flow in the surfaces thereof. Thus, if the protection layer for gate insulation layer is in direct contact with the gate electrode, the parasitic capacitance of the gate electrode will become large. This impedes the high speed operation of a semiconductor device comprising such a MIS field-effect transistor. In addition, a leakage current is generated from the gate electrode, through the protection layer for gate insulation layer, to the semiconductor substrate. This leakage current causes an increase in the current consumption of a semiconductor device comprising such a MIS field-effect transistor. With this configuration, the oxide insulation layer is formed so as to cover the side surface of the gate insulation layer and the side surface of the gate electrode, so these problems can be solved. Note that if the gate electrode is formed of polysilicon or a silicide, the oxide insulation layer will be a silicon oxide layer.

Note also that if the oxide insulation layer is formed in such a manner that the thickness thereof is less than the thickness of the gate insulation layer, and it extends as far as above the pair of source/drain, the protection layer for gate insulation layer is positioned above the oxide insulation layer which is above the pair of source/drain. Thus the protection layer for gate insulation layer is not formed so as to shield the entire side surface of the gate insulation layer, but to shield only part of that side surface. In this case too, it has a protective effect on the gate insulation layer. It should be noted, however, that the protective effect on the gate insulation layer is greater when the protection layer for gate insulation layer is formed to shield the entire side surface of the gate insulation layer.

A first aspect of a semiconductor device comprising a MIS field-effect transistor, the MIS field-effect transistor including:
- a semiconductor substrate having a main surface;
- a gate insulation layer formed on the main surface and having a side surface;
- a gate electrode formed on the gate insulation layer and having a corner portion between a side surface and an upper surface thereof;
- a pair of source/drain formed in the main surface;
- a protection layer for gate insulation layer comprising at least one of a silicon nitride film, a non-doped polysilicon film, and a non-doped amorphous silicon film, the protection layer for gate insulation layer being formed so as to shield the side surface of the gate insulation layer;
- a side-wall insulation layer formed in such a manner that the protection layer for gate insulation layer is sandwiched between the side-wall insulation layer and the side surface of the gate electrode; and
- a silicide layer formed on the upper surface of the gate electrode.

In a preferred configuration of the first aspect of the semiconductor device comprising a MIS field-effect transistor in accordance with the present invention, the protection layer for gate insulation layer is formed so as to shield the side surface of the gate electrode and the side surface of the gate insulation layer from a position corresponding to the corner portion over positions corresponding to the side surface of the gate insulation layer.

With this configuration, the protection layer for gate insulation layer is provided between the silicide layer and the side-wall insulation layer. The presence of this protection layer for gate insulation layer makes it possible to prevent the occurrence of jagged portions in the boundary surface between the silicide layer and the side-wall insulation layer.

In another preferred configuration of the first aspect of the semiconductor device comprising a MIS field-effect transistor in accordance with the present invention, the side-wall insulation layer is formed so as to extend as far as a position corresponding to the corner portion.

In still another preferred configuration of the first aspect of the semiconductor device comprising a MIS field-effect transistor in accordance with the present invention, the side-wall insulation layer is formed to be positioned lower than the corner portion. If this configuration is combined with the configuration in which the protection layer for gate insulation layer is formed so as to shield the side surface of the gate electrode and the side surface of the gate insulation layer from a position corresponding to the corner portion over positions corresponding to the side surface of the gate insulation layer, the thickness of the edge portions of the silicide layer will not become greater than the thickness of the central portion thereof. This is because the presence of the protection layer for gate insulation layer at a position corresponding to the corner portion of the gate electrode will ensure that the refractory metal layer does not form the silicide at the side surface of the gate electrode during the formation of the silicide layer. Thermal stresses in the silicide layer are greater when the thickness thereof is large comparing with when the thickness is small. This configuration ensures that the thickness of the edge portions of the silicide layer can be made smaller, so that the thermal stresses generated in the silicide layer can be reduced. This makes it possible to reduce the thermal stresses given to the gate insulation layer from the silicide layer.

In addition, since the thickness of the edge portions of the silicide layer is the same as the thickness of the central portion thereof, the silicide layer is flat. This is reflected in the intermediary insulation layer positioned above the silicide layer, to be also flat. This makes it possible to avoid problems such as breaks in the wires of the wiring layer when the wiring layer is formed on top of the intermediary insulation layer positioned above the silicide layer.

In a further preferred configuration of the first aspect of the semiconductor device comprising a MIS field-effect transistor in accordance with the present invention, the pair of source/drain comprises a low-density impurity region and a high-density impurity region formed in the main surface.

Yet another preferred configuration of the first aspect of the semiconductor device comprising a MIS field-effect transistor in accordance with the present invention further comprises an oxide insulation layer positioned between the gate electrode and the protection layer for gate insulation layer and formed so as to cover the side surface of the gate electrode and the side surface of the gate insulation layer. Since the protection layer for gate insulation layer has a dielectric constant that is higher than that of the oxide insulation layer, very small currents can easily flow in the surfaces thereof. Thus, if the protection layer for gate insulation layer is in direct contact with the gate electrode, the parasitic capacitance of the gate electrode will become large. This impedes the high speed operation of a semiconductor device comprising such a MIS field-effect transistor. In addition, a leakage current is generated from the gate electrode, through the protection layer for gate insulation layer, to the silicon substrate. This leakage current causes an increase in the current consumption of a semiconductor device comprising such a MIS field-effect transistor. With this configuration, the oxide insulation layer is formed so as to cover the side surface of the gate insulation layer and the side surface of the gate electrode, so these problems can be solved. Note that if the gate electrode is formed of polysilicon or a silicide, the oxide insulation layer will be a silicon oxide layer.

In a still further preferred configuration of the first aspect of the semiconductor device comprising a MIS field-effect transistor in accordance with the present invention, the oxide insulation layer is formed so that the thickness thereof is less than the thickness of the gate insulation layer and it also extends as far as on the pair of source/drain. The protection layer for gate insulation layer is positioned on the oxide insulation layer which is on the pair of source/drain.

In a yet further preferred configuration of the first aspect of the semiconductor device comprising a MIS field-effect transistor in accordance with the present invention, the protection layer for gate insulation layer has a thickness that is greater than or equal to 2 nm but less than 10 nm. This thickness is made to be greater than or equal to 2 nm because it is thought that if the thickness of the protection layer for gate insulation layer is smaller than this value, it will not fulfill the role of protecting the gate insulation layer. The technique disclosed in Japanese Patent Application Laid-Open No. 9-162402 sets the thickness of the silicon nitride layer to 10 nm. With the technique disclosed in that document, it is thought to be difficult to make the thickness of a silicon nitride layer less than 10 nm. That is to say, the n-type regions 214 are formed directly under the silicon nitride layer 210 in FIG. 42. If the thickness of the silicon nitride layer 210 is less than 10 nm, it is thought that the n-type regions 214 will be absorbed into the n-type region 218. With the configuration of the invention, no such independent impurity region is formed below the protection layer for gate insulation layer, so that the thickness of the protection layer for gate insulation layer can be made less than 10 nm.

In an even further preferred configuration of the first aspect of the semiconductor device comprising a MIS field-effect transistor in accordance with the present invention, the side-wall insulation layer includes a silicon oxide layer comprising at least one of phosphorus and boron.

In a final preferred configuration of the first aspect of the semiconductor device comprising a MIS field-effect transistor in accordance with the present invention, the pair of source/drain is provided with an edge portion such that the edge portion is at a position that overlaps the gate electrode.

A second aspect of a semiconductor device comprising a MIS field-effect transistor, the MIS field-effect transistor including:

- a semiconductor substrate having a main surface;
- a gate insulation layer formed on the main surface and having a side surface;
- a gate electrode formed on the gate insulation layer and having a corner portion between a side surface and an upper surface thereof;
- a pair of source/drain formed in the main surface; and
- a protection layer for gate insulation layer having a thickness that is greater than or equal to 2 nm but less than 10 nm, that is formed so as to shield the side surface of the gate insulation layer and comprises at least one of a silicon nitride film, a non-doped polysilicon film, and a non-doped amorphous silicon film.

In the second aspect of the semiconductor device comprising a MIS field-effect transistor in accordance with the present invention, the protection layer for gate insulation layer has a thickness that is greater than or equal to 2 nm but less than 10 nm. The reasons for this are the same as the numerical limitations described above with respect to the first aspect of the semiconductor device comprising a MIS field-effect transistor in accordance with the present invention. A preferred configuration of the second aspect of the semiconductor device comprising a MIS field-effect transistor in accordance with the present invention further comprises an oxide insulation layer positioned between the gate electrode and the protection layer for gate insulation layer and formed to cover the side surface of the gate electrode and the side surface of the gate insulation layer.

Since the protection layer for gate insulation layer has a dielectric constant that is higher than that of the oxide insulation layer, very small currents can easily flow in the surfaces thereof. Thus, if the protection layer for gate insulation layer is in direct contact with the gate electrode, the parasitic capacitance of the gate electrode will become large. This impedes the high speed operation of a semiconductor device comprising such a MIS field-effect transistor. In addition, a leakage current is generated from the gate electrode, through the protection layer for gate insulation layer, to the silicon substrate. This leakage current causes an increase in the current consumption of a semiconductor device comprising such a MIS field-effect transistor. With this configuration, the oxide insulation layer is formed so as to cover the side surface of the gate insulation layer and the side surface of the gate electrode, so these problems can be solved. Note that if the gate electrode is formed of polysilicon or a silicide, the oxide insulation layer will be a silicon oxide layer.

In another preferred configuration of the second aspect of the semiconductor device comprising a MIS field-effect transistor in accordance with the present invention, the oxide insulation layer is formed so that the thickness thereof is less than the thickness of the gate insulation layer and it also extends as far as on the pair of source/drain. The protection layer for gate insulation layer may be positioned above the oxide insulation layer which is above the pair of source/drain.

Yet another preferred configuration of the second aspect of the semiconductor device comprising a MIS field-effect transistor in accordance with the present invention further comprises: a side-wall insulation layer formed in such a manner that the protection layer for gate insulation layer is sandwiched between the side-wall insulation layer and the side surface of the gate electrode.

In still another preferred configuration of the second aspect of the semiconductor device comprising a MIS field-effect transistor in accordance with the present invention, the pair of source/drain comprises a low-density impurity region and a high-density impurity region. In a further preferred configuration of the second aspect of the semiconductor device comprising a MIS field-effect transistor in accordance with the present invention, the protection layer for gate insulation layer is formed to extend from a position corresponding to the corner portion and over positions corresponding to the side surface of the gate insulation layer. In a yet further preferred configuration of the second aspect of the semiconductor device comprising a MIS field-effect transistor in accordance with the present invention, the side-wall insulation layer is formed so as to extend as far as a position corresponding to the corner portion. In an even further preferred configuration of the second aspect of the semiconductor device comprising a MIS field-effect transistor in accordance with the present invention, the side-wall insulation layer is formed to be positioned lower than the corner portion.

A still further preferred configuration of the second aspect of the semiconductor device comprising a MIS field-effect transistor in accordance with the present invention also comprises a silicide layer formed on the upper surface of the gate electrode. If this configuration is combined with a configuration in which the protection layer for gate insulation layer is formed to extend from a position corresponding to the corner portion and over positions corresponding to the side surface of the gate insulation layer, the protection layer for gate insulation layer lies between the silicide layer and the side-wall insulation layer. The presence of this protection layer for gate insulation layer makes it possible to prevent the occurrence of jagged portions in the boundary surface between the silicide layer and the side-wall insulation layer. Furthermore, if this configuration is combined with the configuration in which the protection layer for gate insulation layer is formed to extend from a position corresponding to the corner portion and over positions corresponding to the side surface of the gate insulation layer, and also with a configuration in which the side-wall insulation layer is formed so as to be positioned lower than the corner portion, the thickness of the edge portions of the silicide layer will not become greater than the thickness of the central portion thereof. This is because the presence of the protection layer for gate insulation layer at a position corresponding to the corner portion of the gate electrode will ensure that the refractory metal layer does not form the silicide at the side surface of the gate electrode during the formation of the silicide layer. Thermal stresses in the silicide layer are greater when the thickness thereof is large comparing with when the thickness is small. Since the thickness of the edge portions of the silicide layer can be made smaller, the thermal stresses generated in the silicide layer can be reduced. This ensures that the thermal stresses acting on the gate insulation layer can also be reduced. In addition, since the thickness of the edge portions of the silicide layer is the same as the thickness of the central portion thereof, the silicide layer is flat. This is reflected in the intermediary insulation layer positioned above the silicide layer, to be also flat. This makes it possible to avoid problems such as breaks in the wires of the wiring layer when the wiring layer is formed on top of the intermediary insulation layer positioned above the silicide layer.

In yet another preferred configuration of the second aspect of the semiconductor device comprising a MIS field-effect transistor in accordance with the present invention, the pair of source/drain is provided with an edge portion such that the edge portion is at a position that overlaps the gate electrode. In a final preferred configuration of the second aspect of the semiconductor device comprising a MIS field-effect transistor in accordance with the present invention, the side-wall insulation layer comprises a silicon oxide layer comprising at least one of phosphorus and boron.

The material of the gate insulation layer of the present invention could be a silicon oxide film, a SiON film, or a tantalum oxide film. The low-density impurity region and the high-density impurity region could be of an LDD structure, for example. The various aspects of the method of the present invention can be applied to making the protection layer for gate insulation layer have a thickness that is greater than or equal to 2 nm but less than 10 nm.

When a silicide is formed on the upper surface of the gate electrode by self-alignment in the present invention, it is necessary to fabricate at least the upper surface of the gate electrode of a material comprising silicon.

To achieve the effect of preventing excessive silicide reactions and also preventing the occurrence of electrostatic charges in the configuration of the upper surface of the gate electrode comprising a silicide, it is necessary to make the protection layer for gate insulation layer a silicon nitride layer.

DESCRIPTION OF PREFERRED EMBODIMENTS

First Embodiment

Figure 1:
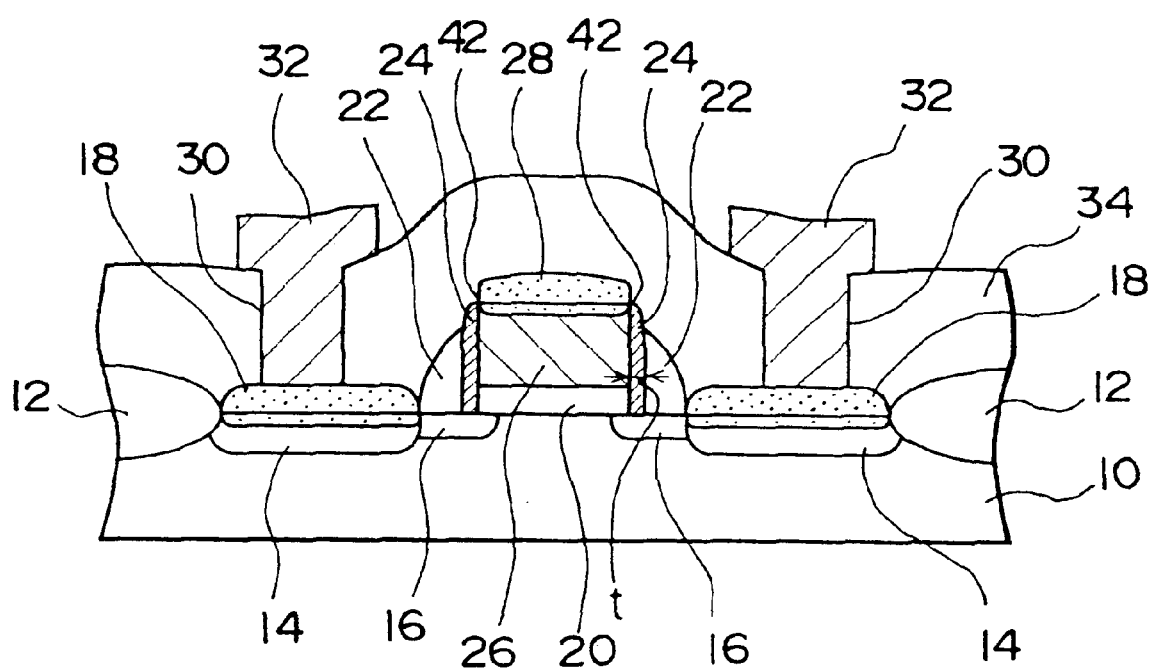
FIG. 1 is a cross-sectional view of a first embodiment of the present invention.

A cross-sectional view through a first embodiment of the present invention is shown in FIG. 1. A gate oxide layer 20 that an example of a gate insulation layer is an formed on the main surface of a silicon substrate 10 that is an example of a semiconductor substrate. A gate electrode 26 is formed on top of the gate oxide layer 20. One of the following materials is used as the material of the gate electrode 26: (1) a polycrystalline silicon including phosphorus, arsenic, boron, or the like; (2) a silicide formed by the reaction of silicon with a refractory metal such as tungsten, molybdenum, platinum, nickel, titanium, or cobalt; or (3) a refractory metal or a conductive metal such as aluminum. One of the materials (1), (2), and (3) could be used alone for the gate electrode 26, or a combination thereof could be used in a multilayer structure. A silicon nitride layer 24 is formed so as to shield the side surfaces of the gate oxide layer 20 and the side surfaces of the gate electrode 26 from a position that corresponds to corner portions 42 formed by the side surfaces and an upper surface of the gate electrode 26 and over positions corresponding to the side surfaces of the gate oxide layer 20. The silicon nitride layer 24 is laid directly on top of the main surface of the silicon substrate 10. Thus the silicon nitride layer 24 completely covers the side surface of the gate oxide layer 20. The silicon nitride layer 24 is an example of a protection layer for gate insulation layer. Note that the thickness of the silicon nitride layer 24, indicated by t in the figure, is preferably at least 2 nm but less than 10 nm.

A side-wall silicon oxide layer 22 is formed as an example of a side-wall insulation layer, in such a manner as to sandwich the silicon nitride layer 24 between itself and the side surface of the gate electrode 26. The side-wall silicon oxide layer 22 is subjected to over-etching. This ensures that the side-wall silicon oxide layer 22 is positioned lower than the corner portions 42. A titanium silicide layer 28 is formed on the upper surface of the gate electrode 26, as an example of a silicide layer.

N⁻-type regions 16 are formed on the main surface of the silicon substrate 10, positioned below the side-wall silicon oxide layer 22. N⁺-type regions 14 are formed adjacent to the n⁻-type regions 16, on the main surface of the silicon substrate 10. A source/drain of an LDD structure are formed by these pairs of n⁺-type regions 14 and n⁻-type regions 16. Titanium silicide layers 18 are formed above the n⁺-type regions 14. An intermediary insulation layer 34 is formed on the main surface of the silicon substrate 10 so as to cover the gate electrode 26 and the source/drain. The material of the intermediary insulation layer 34 could be a film of silicon oxide, PSG, BSG, or BPSG, for example. One of these substances could be used alone as the intermediary insulation layer 34, or they could be combined to form a intermediary insulation layer 34 of a multi-layer structure. Contact holes 30 are formed in the intermediary insulation layer 34, to reach as far as the titanium silicide layers 18. A wiring layer 32 is formed on top of the intermediary insulation layer 34. The wiring layer 32 is also formed in the interior of the contact holes 30, and the wiring layer 32 and the titanium silicide layers 18 are connected electrically thereby. An aluminum, an aluminum alloy containing copper, or a refractory metal such as titanium could be used as the material of the wiring layer 32. Such metals could be used alone or in combination as the wiring layer 32. Note that reference number 12 denotes a field oxide layer.

Figure 2:
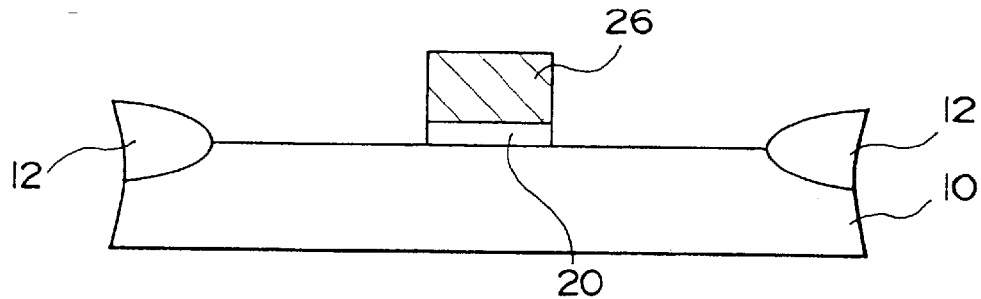
FIG. 2 shows a first step in the fabrication of a first embodiment of the present invention.

The description now turns to the method of fabricating the configuration shown in FIG. 1. The field oxide layer 12 for separating elements is formed on the main surface of the silicon substrate 10, as shown in FIG. 2. The gate oxide layer 20 is then formed on the main surface of the silicon substrate 10 by a method such as a thermal oxidation. The thickness of the gate oxide layer 20 is between a fewnm and 100 nm. A polysilicon layer is formed over the entire main surface of the silicon substrate 10 by a method such as CVD. Phosphorous is included within the polysilicon layer as an impurity, to ensure that the polysilicon layer is conductive. A photoresist is applied over the polysilicon layer, and that photoresist is subjected to given patterning. The thus patterned photoresist is used as a mask for selective etching of the polysilicon layer by anisotropic etching, to form the gate electrode 26. Generally, the method used for the anisotropic etching of the polysilicon layer is such that a gas such as freon or a halogen flows at a reduced pressure on the order of a few tens of mTorr, a high-frequency plasma is generated therefrom, and etching is performed by that high-frequency plasma.

Figure 3:
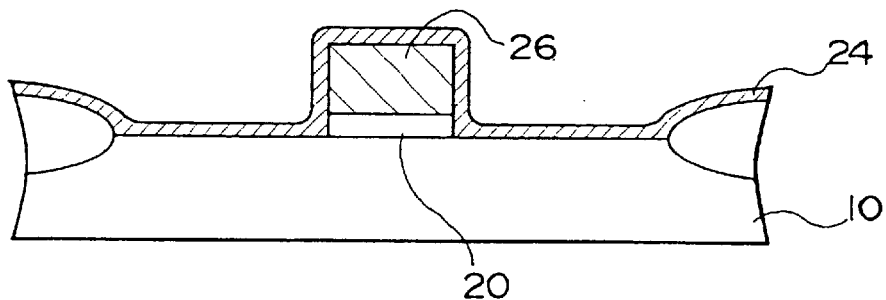
FIG. 3 shows a second step in the fabrication of the first embodiment of the present invention.

The silicon nitride layer 24 is formed over the entire main surface of the silicon substrate 10 to cover the gate oxide layer 20 and the gate electrode 26, as shown in FIG. 3. A CVD method using dichloramine and ammonia as material gases could be used by way of example as the method of forming the silicon nitride layer 24.

Figure 4:
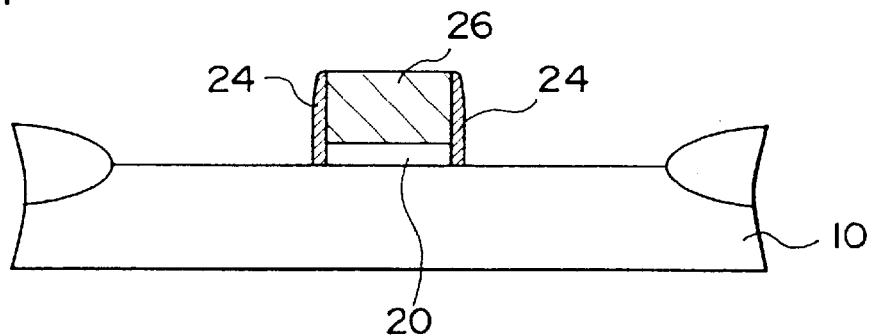
FIG. 4 shows a third step in the fabrication of the first embodiment of the present invention.

The silicon nitride layer 24 is etched back by anisotropic etching, as shown in FIG. 4. This leaves the silicon nitride layer 24 at positions shielding the side surfaces of the gate electrode 26 and the gate oxide layer 20. The method of performing anisotropic etching on the silicon nitride layer 24 could be one in which a freon type of gas flows at a reduced pressure of, for example, approximately 0.1 Torr, a high-frequency plasma is generated therefrom, and etching is performed by that high-frequency plasma.

Figure 5:
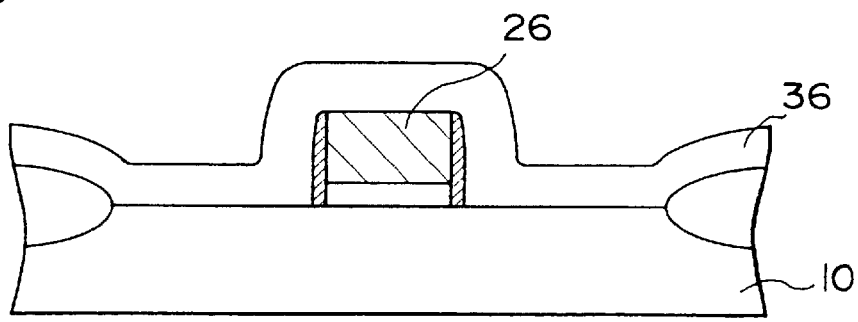
FIG. 5 shows a fourth step in the fabrication of the first embodiment of the present invention.

A silicon oxide layer 36 including phosphorus is formed over the entire main surface of the silicon substrate 10 so as to cover the gate electrode 26, as shown in FIG. 5, using a method such as CVD. A thermochemical reaction method using nitrogen as a carrier gas with monosilane, oxygen, and a small quantity of phosphine is used by way of example as the CVD method for forming the silicon oxide layer 36. The density of phosphorus in the silicon oxide layer 36 is 2 to 10 mol %.

Figure 6:
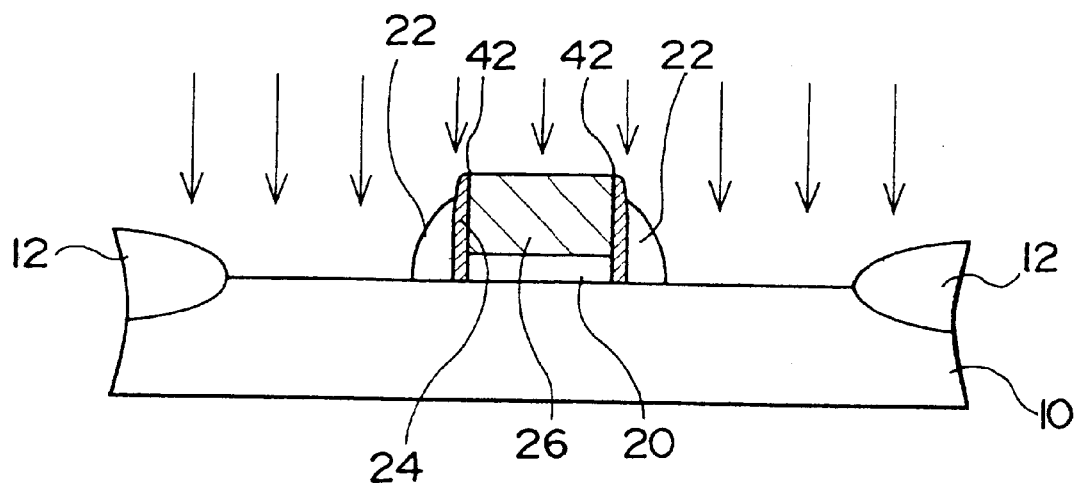
FIG. 6 shows a fifth step in the fabrication of the first embodiment of the present invention.

Anisotropic etching is used to etch back the silicon oxide layer 36, to form the side-wall silicon oxide layer 22 around the silicon nitride layer 24, as shown in FIG. 6. Since the side-wall silicon oxide layer 22 is over-etched, it is positioned below the corner portions 42. The gate electrode 26, the side-wall silicon oxide layer 22, and the field oxide layer 12 are used as a mask for the implantation of arsenic ions into the main surface of the silicon substrate 10. This ion implantation is perpendicular to the main surface of the silicon substrate 10. The dosage of the implantation of arsenic ions is $1\times10^{15}/cm^2$ to $1\times10^{16}/cm^2$.

Figure 7:
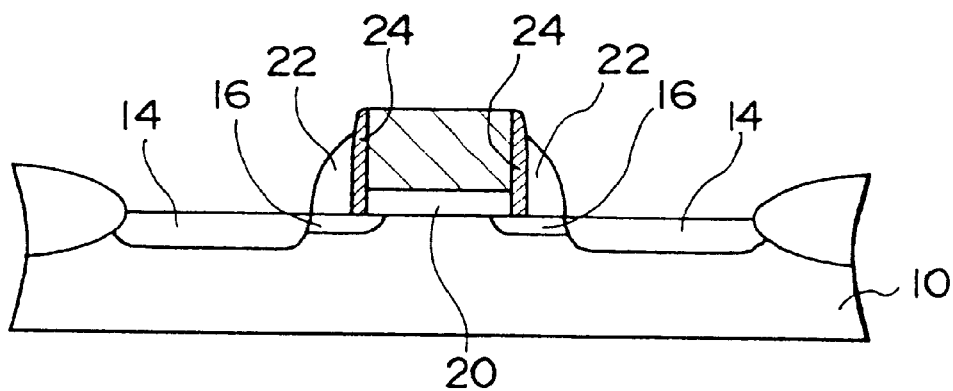
FIG. 7 shows a sixth step in the fabrication of the first embodiment of the present invention.

The silicon substrate 10 is subjected to thermal treatment to activate the arsenic that has been implanted into the silicon substrate 10 and thus form the n$^+$-type regions 14, as shown in FIG. 7. This thermal treatment diffuses the phosphorus comprised within the side-wall silicon oxide layer 22 into the main surface of the silicon substrate 10, to form the n$^-$-type regions 16. During this diffusion, the silicon nitride layer 24 is between the side surfaces of the side-wall silicon oxide layer 22 and the gate oxide layer 20. This makes it possible to prevent the phosphorus from diffusing into the edge portions of the gate oxide layer 20. Even if arsenic or boron is incorporated as an impurity within the side-wall silicon oxide layer 22, diffusion of the arsenic or boron into the edge portions of the gate oxide layer 20 cannot occur.

Figure 8:
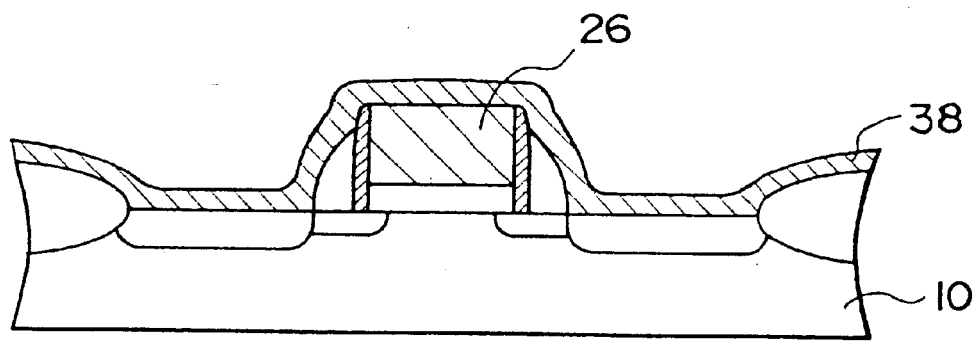
FIG. 8 shows a seventh step in the fabrication of the first embodiment of the present invention.

A titanium layer 38 is formed by a method such as sputtering over the entire main surface of the silicon substrate 10 so as to cover the gate electrode 26, as shown in FIG. 8.

Figure 9:
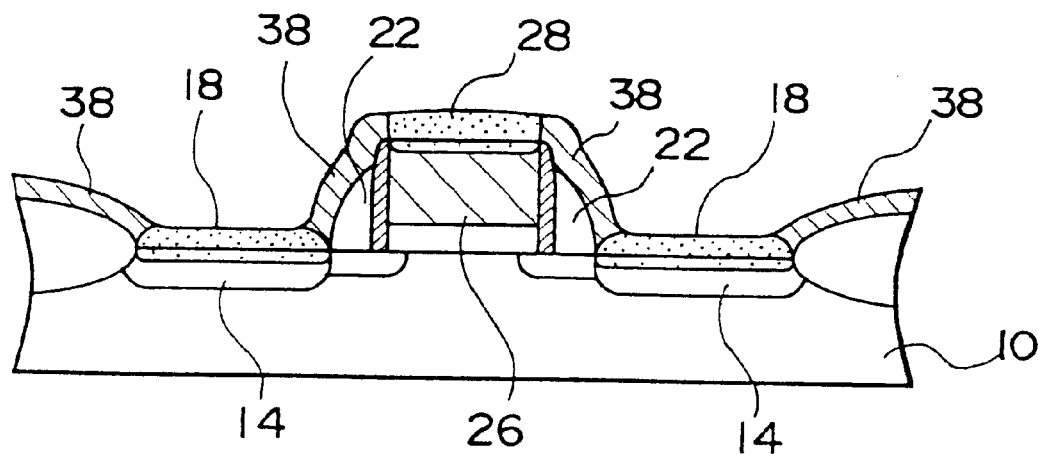
FIG. 9 shows an eighth step in the fabrication of the first embodiment of the present invention.

The titanium layer 38 is subjected to thermal treatment by lamp-annealing at 600 to 750° C. to form the titanium silicide layers 28 and 18 on the upper surface of the gate electrode 26 and on top of the n$^+$-type regions 14, as shown in FIG. 9. The crystalline structure of the titanium silicide layers 18 and 28 is C49.

Figure 10:
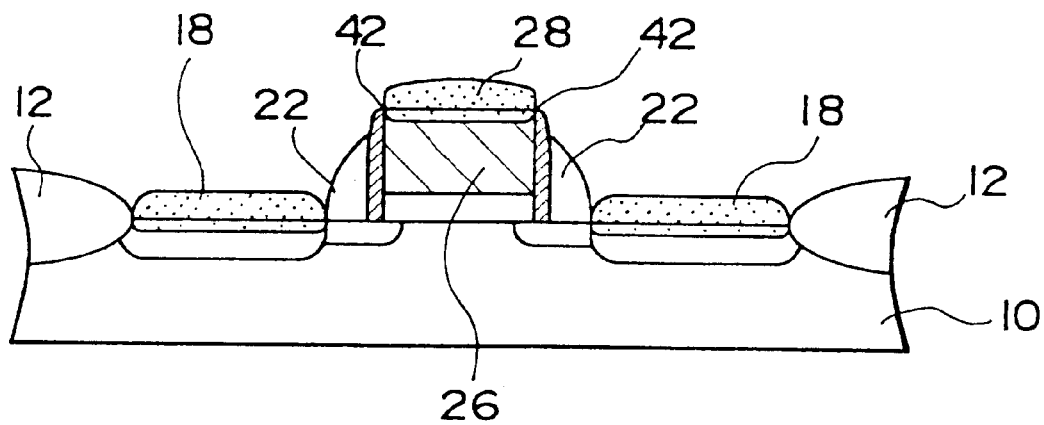
FIG. 10 shows a ninth step in the fabrication of the first embodiment of the present invention.

The unreacted titanium layer positioned on top of the field oxide layer 12 and the side-wall silicon oxide layer 22 is removed by using an ammonia type of substance, as shown in FIG. 10. The titanium silicide layers 18 and 28 are then subjected to thermal treatment at 700 to 900° C. This thermal treatment changes the crystalline structure of the titanium silicide layer to C54. The C54 structure has a smaller electrical resistance than the C49 structure. When the crystalline structure of the titanium silicide layer were to be C49, thermal stresses would be generated in the titanium silicide layer and these effects would reach as far as the gate oxide layer. Even when the crystalline structure of the titanium silicide layer is changed from C49 to C54, thermal stresses will occur in the titanium silicide layer. These thermal stresses will affect the gate oxide layer. Thus, if the titanium layer positioned at the corner portions 42 reacts excessively so that the thickness of the edge portions of the titanium suicide layer 28 becomes too great, the above described thermal stresses will also increase. In this first embodiment of the invention, the silicon nitride layer 24 prevents the titanium layer from reacting excessively at the corner portions 42.

The description now returns to the fabrication process. The intermediary insulation layer 34, comprising a silicon oxide layer by way of example, is formed on the main surface of the silicon substrate 10 so as to cover the gate electrode 26, as shown in FIG. 1. The intermediary insulation layer 34 is selectively etched to form the contact holes 30 as far as the titanium silicide layers 18. A layer of aluminum is then formed on top of the intermediary insulation layer 34 by using a method such as sputtering. This aluminum layer is also formed within the contact holes 30. The wiring layer 32 is created by subjecting this aluminum to given patterning.

Second Embodiment

Figure 11:
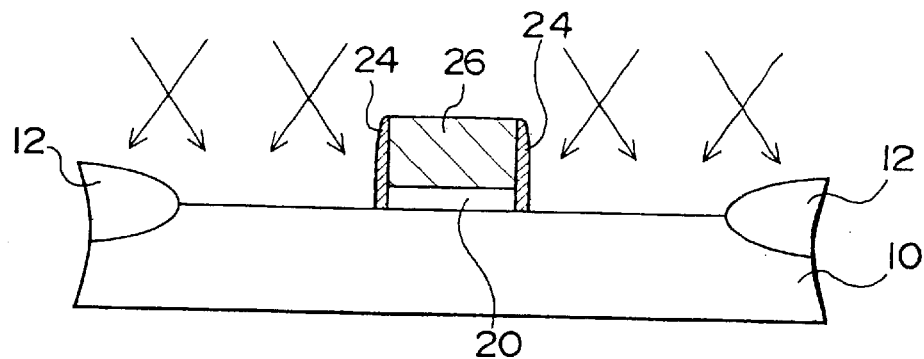
FIG. 11 shows a first step in the fabrication of a second embodiment of the present invention.

A second embodiment of the present invention will now be described. First of all, the configuration shown in FIG. 4 is fabricated by the same method as that of the first embodiment. Tilted ion implantation is then performed on the main surface of the silicon substrate 10, using the gate electrode 26 and the field oxide layer 12 as a mask, as shown in FIG. 11. This tilted ion implantation is a method of implanting ions at a predetermined angle with respect to the main surface of the silicon substrate 10, such as at 70. The dosage of the ion implantation dosage is $1\times10^{12}/cm^2$ to $1\times10^{14}/cm^2$. For an n-channel device, a plasma is created from a source gas such as phosphine or arsine, and ions of the thus-extracted phosphorus or arsenic are accelerated to be implanted into the silicon substrate. For a p-channel device, a plasma is created from a source gas such as diborane, and ions of the thus-extracted boron are accelerated to be implanted into the silicon substrate. The silicon nitride layer 24 is placed so as to shield the side surfaces of the gate oxide layer 20. The incoming ions strike the silicon nitride layer 24, making it possible to prevent them from striking the side surfaces of the gate oxide layer 20. This makes it possible to prevent the occurrence of places where the bonding of the crystalline structure are broken in the edge portions of the gate oxide layer 20.

Figure 12:
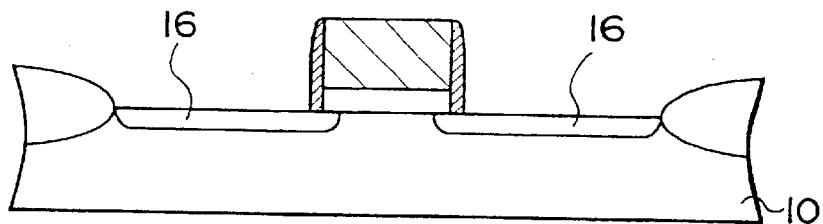
FIG. 12 shows a second step in the fabrication of the second embodiment of the present invention.

The ions implanted into the silicon substrate 10 are subjected to thermal treatment. This activates the ions to form the n$^-$-type regions 16 in the main surface of the silicon substrate 10, as shown in FIG. 12. Other methods could be used for forming the n$^-$-type regions 16, such as diffusion. This diffusion is a method of diffusing phosphorus, which is obtained by the thermal decomposition of a mixture of gases such as phosphorus oxychloride, oxygen, and nitrogen, into the silicon substrate 10. Since the silicon nitride layer 24 is placed so as to shield the side surfaces of the gate oxide layer 20, in that case the phosphorus can be prevented from penetrating the edge portions of the gate oxide layer 20 from the side surfaces of the gate oxide layer 20.

Figure 13:
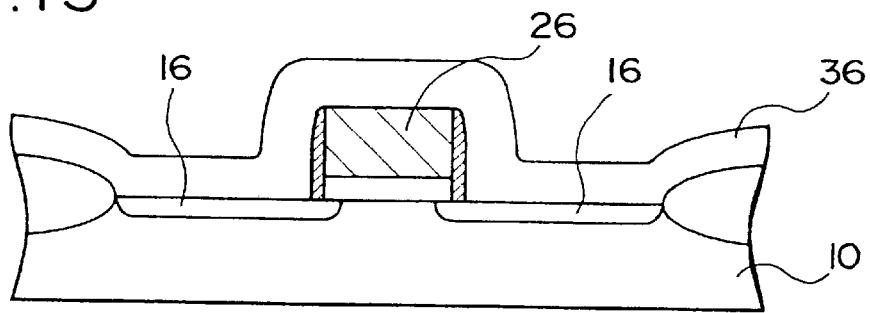
FIG. 13 shows a third step in the fabrication of the second embodiment of the present invention.

The silicon oxide layer 36 is formed on the main surface of the silicon substrate 10 so as to cover the gate electrode 26, by using a method such as CVD, as shown in FIG. 13. Note that the n$^-$-type regions 16 have already been formed below the portions where the side-wall silicon oxide layer will be. This means that the silicon oxide layer 36 does not need to include impurities. It should be noted however, that impurities could be included within the silicon oxide layer 36 in order to improve the quality of the film that forms the silicon oxide layer 36.

Figure 14:
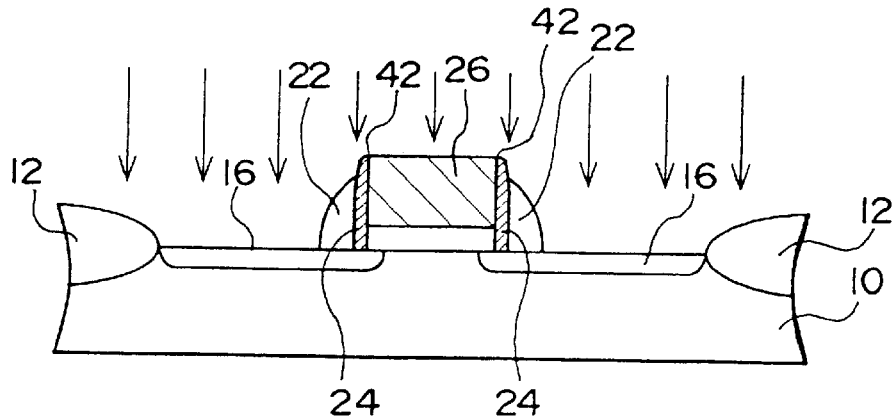
FIG. 14 shows a fourth step in the fabrication of the second embodiment of the present invention.

The silicon oxide layer 36 is etched by using a similar method to that of the first embodiment, to form the side-wall silicon oxide layer 22 around the silicon nitride layer 24, as shown in FIG. 14. The side-wall silicon oxide layer 22 is over-etched so that it is positioned lower than the corner portions 42. Ions of an impurity are then implanted into the main surface of the silicon substrate 10 by a method similar to that of the first embodiment.

Figure 15:
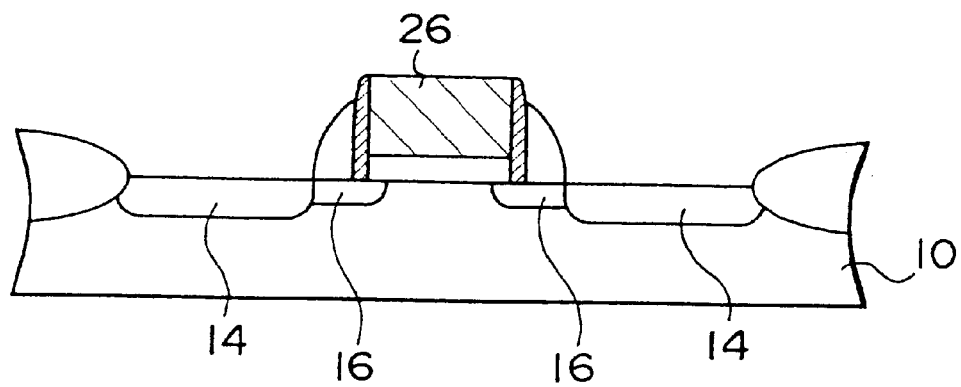
FIG. 15 shows a fifth step in the fabrication of the second embodiment of the present invention.

The silicon substrate 10 is subjected to thermal treatment to activate the ions implanted into the silicon substrate 10 and thus form the n$^+$-type regions 14, as shown in FIG. 15. Note that if a silicide layer is to be formed on the upper surface of the gate electrode 26, the same steps as those shown in FIGS. 8 to 10 for the first embodiment could be performed.

Third Embodiment

Figure 16:
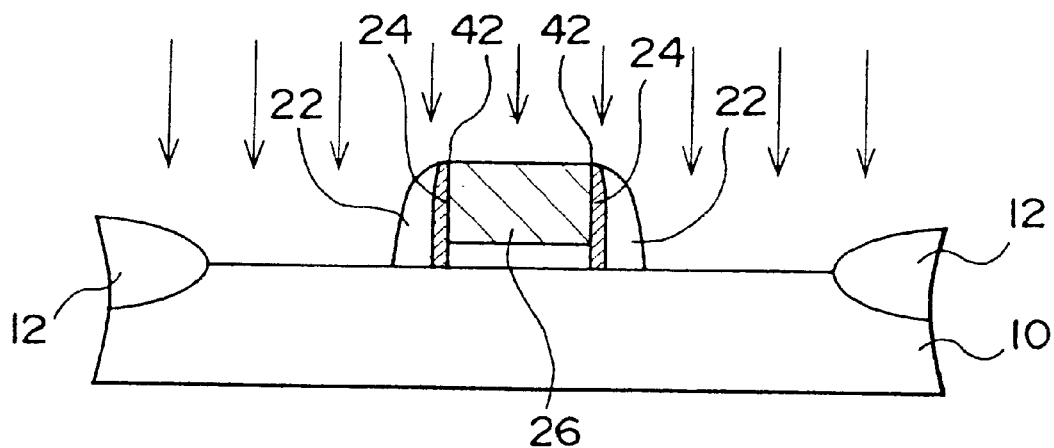
FIG. 16 shows a first step in the fabrication of a third embodiment of the present invention.

First of all, the configuration shown in FIG. 5 is fabricated by the same method as that of the first embodiment. The silicon oxide layer 36 is then etched back by anisotropic etching to form the side-wall silicon oxide layer 22, as shown in FIG. 16. Note that the side-wall silicon oxide layer 22 is not over-etched in the present embodiment. This means that the side-wall silicon oxide layer 22 extends as far as a position at which it shields the corner portions 42. The gate electrode 26, the side-wall silicon oxide layer 22, and the field oxide layer 12 are then used as a mask for the implantation of ions of an impurity into the main surface of the silicon substrate 10, using a method similar to that shown in FIG. 6 for the first embodiment.

Figure 17:
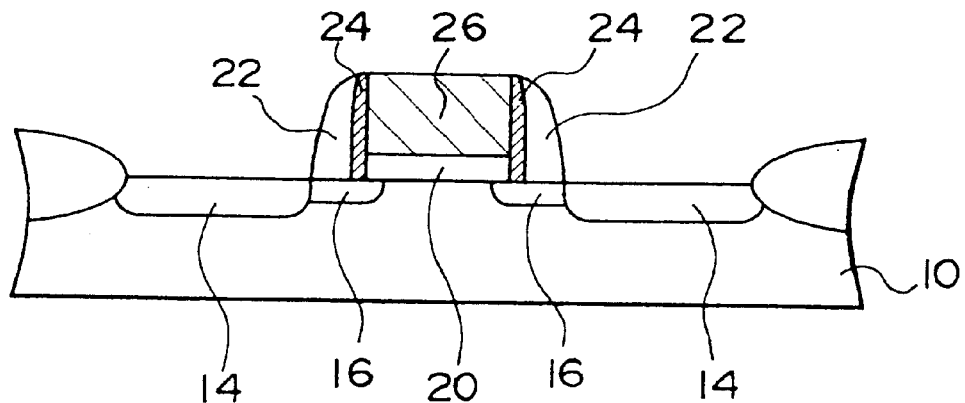
FIG. 17 shows a second step in the fabrication of the third embodiment of the present invention.

The silicon substrate 10 is subjected to the same thermal treatment as that of the step shown in FIG. 7 for the first embodiment, to activate the ions that have been implanted into the silicon substrate 10 and thus form the n$^+$-type regions 14, as shown in FIG. 17. At the same time, the impurities included within the side-wall silicon oxide layer 22 diffuse into the main surface of the silicon substrate 10 to form the n$^-$-type regions 16. During this diffusion, the silicon nitride layer 24 is between the side-wall silicon oxide layer 22 and the gate oxide layer 20. This makes it possible to prevent impurities from penetrating into the edge portions of the gate oxide layer 20 from the side surfaces of the gate oxide layer 20. Note that the n$^-$-type regions 16 may be formed by implanting ions into the silicon substrate 10 before the formation of the side-wall silicon oxide layer 22.

Figure 18:
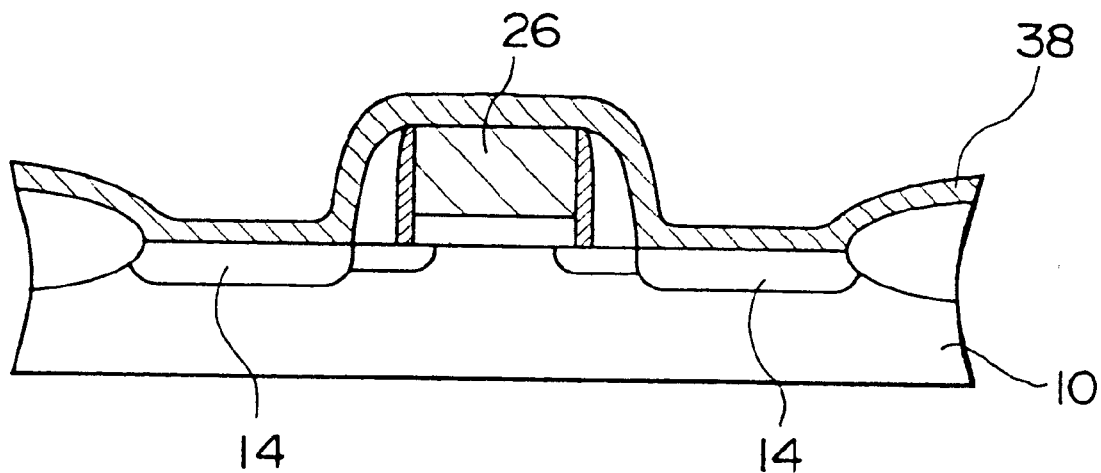
FIG. 18 shows a third step in the fabrication of the third embodiment of the present invention.

The titanium layer 38, as an example of a refractory metal layer, is then formed over the entire main surface of the silicon substrate 10 by a method such as sputtering, as shown in FIG. 18.

Figure 19:
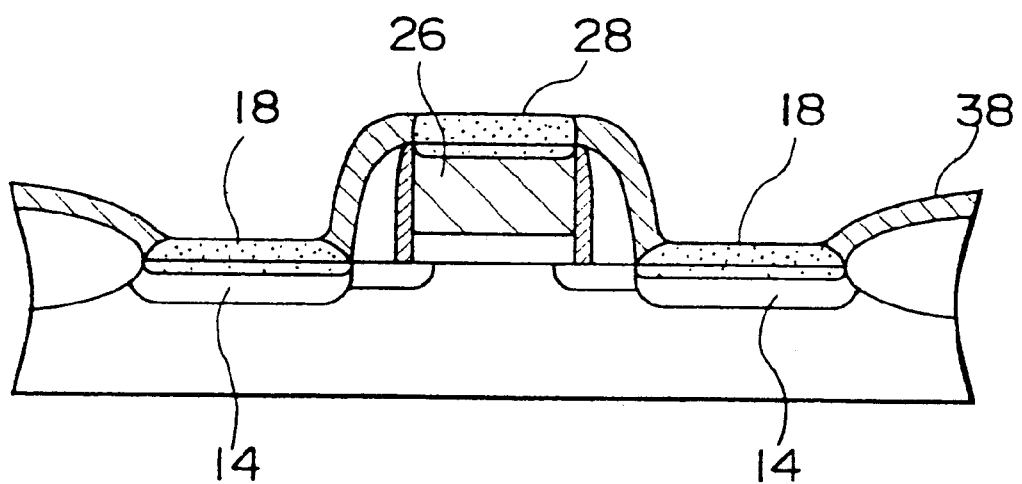
FIG. 19 shows a fourth step in the fabrication of the third embodiment of the present invention.

The titanium layer 38 is subjected to thermal treatment to form the titanium silicide layers 28 and 18 on the upper surface of the gate electrode 26 and on top of the n$^+$-type regions 14, as shown in FIG. 19. The crystalline structure of this titanium silicide layer is C49.

Figure 20:
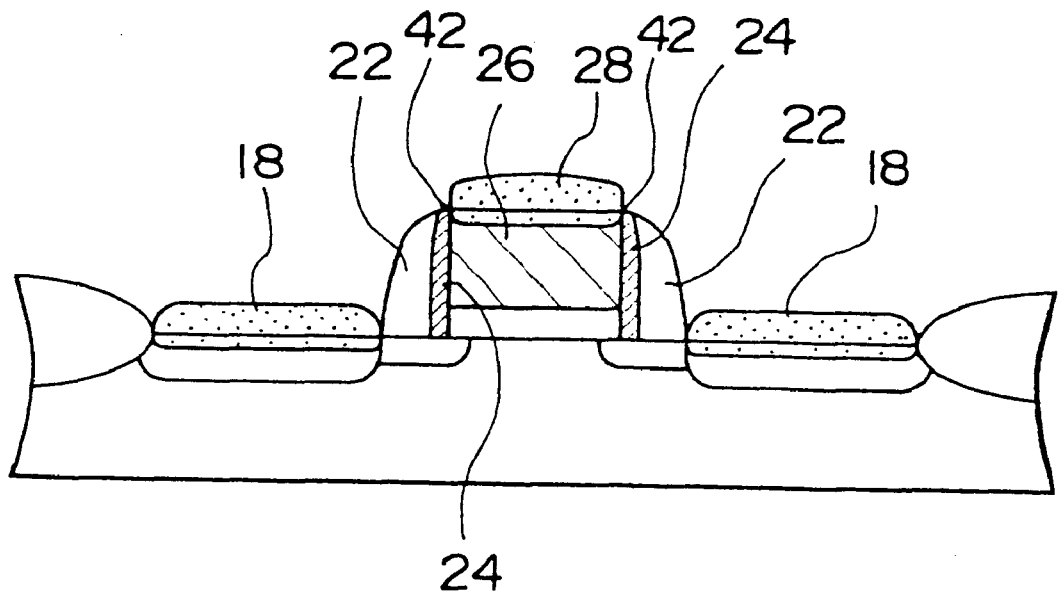
FIG. 20 shows a fifth step in the fabrication of the third embodiment of the present invention.
Figure 21:
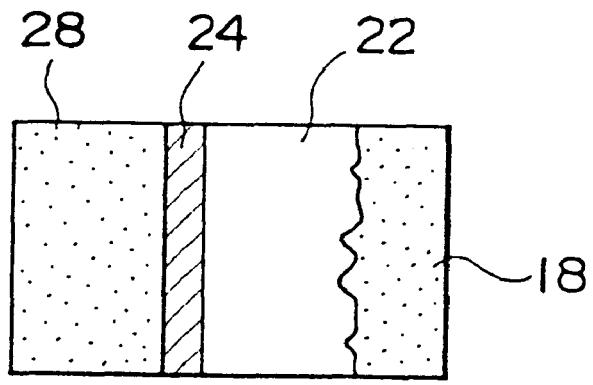
FIG. 21 is a partial plan view of the structure shown in FIG. 20.

The unreacted parts of the titanium layer 38 are removed by using an ammonia type of substance, as shown in FIG. 20. The titanium silicide layers 18 and 28 are again subjected to thermal treatment. This changes the crystalline structure of the titanium silicide layer to C54. The side-wall silicon oxide layer 22 is formed as far as a position corresponding to the corner portions 42. Therefore, even if there is no silicon nitride layer 24, the thickness of the edge portions of the titanium silicide layer 28 does not necessarily become greater than the thickness of the central portion thereof. It should be noted, however, that if the silicon nitride layer 24 is formed as far as the position of the corner portions 42, the effects described below are obtained. A partial plan view of the structure of FIG. 20 is shown in FIG. 21. The silicon nitride layer 24 is between the titanium silicide layer 28 and the side-wall silicon oxide layer 22. The presence of this silicon nitride layer 24 makes it possible to prevent the occurrence of jagged portions in the boundary between the titanium silicide layer 28 and the side-wall silicon oxide layer 22.

Fourth Embodiment

Figure 22:
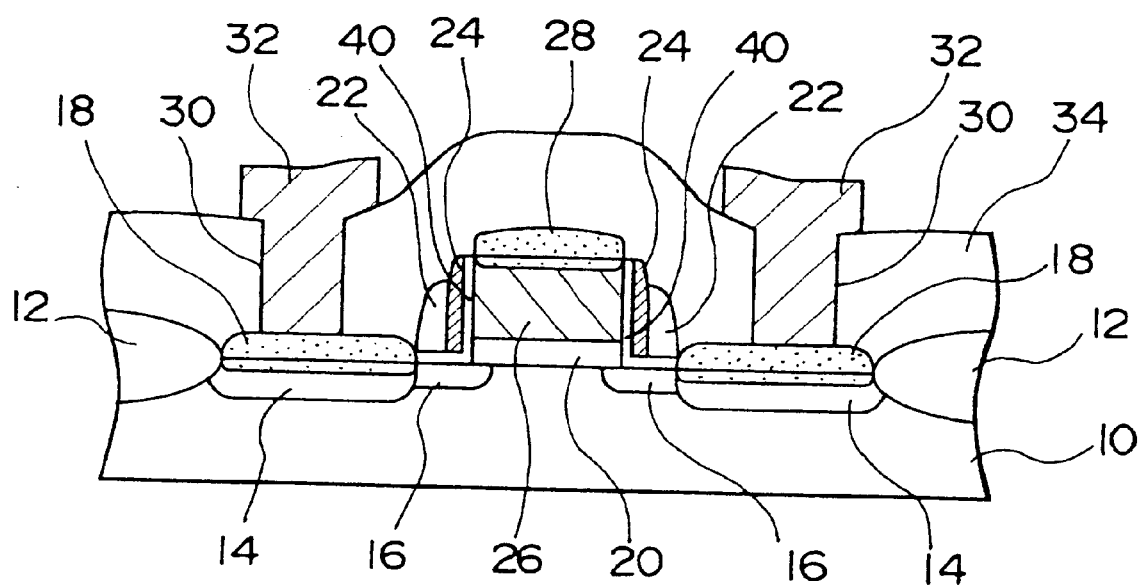
FIG. 22 is a cross-sectional view through a fourth embodiment of the present invention.

A cross-sectional view through a fourth embodiment of the present invention is shown in FIG. 22. The difference between the present embodiment and the first embodiment shown in FIG. 1 lies in the formation of an oxide insulation layer 40 that extends from the side surfaces of the gate electrode 26 over the n$^-$-type regions 16. All other parts of the structure are the same as those shown in FIG. 1, so they are given the same reference numbers and further description is omitted.

When the polysilicon layer is removed by selective etching to form the gate electrode 26, the polysilicon layer is over-etched. This is to ensure that no stepped portions remain in the polysilicon layer, such as at the boundary between the field oxide layer and the active region. During the formation of the gate electrode 26, the side surfaces of the gate oxide layer 20 are exposed. This means that the ions or atoms generated during the etching strikes the side surfaces of the gate oxide layer 20 and damage the edge portions of the gate oxide layer 20. To recover from this damage, the gate oxide layer 20 is subjected to thermal treatment in an oxygen-rich environment comprising oxygen or water vapor. This thermal treatment forms the oxide insulation layer 40 on the main surface of the silicon substrate 10, the side surfaces of the gate oxide layer 20, the side surfaces of the gate electrode 26, and the upper surface of the gate electrode 26. In general, the thickness of the oxide insulation layer 40 is greater than or equal to one-half the thickness of the gate oxide layer but less than the entire thickness of the gate oxide layer. The positioning of the oxide insulation layer 40 between the gate electrode 26 and the silicon nitride layer 24 has the effects discussed below. The silicon nitride layer has a higher dielectric constant than the silicon oxide layer, so that very small currents can easily flow in the surfaces thereof. Thus, if the silicon nitride layer is placed in direct contact with the gate electrode, the parasitic capacitance of the gate electrode will become large. This impedes the high speed operation of a semiconductor device comprising such a MIS field-effect transistor. In addition, a leakage current is occurred from the gate electrode, through the silicon nitride layer, to the silicon substrate. This leakage current causes an increase in the current consumption of a semiconductor device comprising such a MIS field-effect transistor. Note that if the gate electrode is formed of polysilicon or a silicide, the oxide insulation layer will be a silicon oxide layer.

Figure 23:
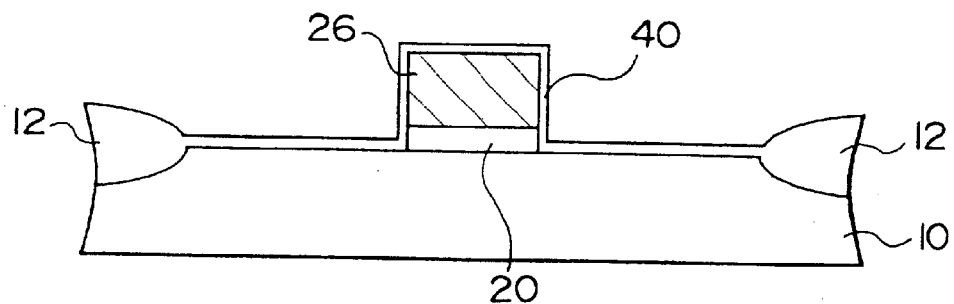
FIG. 23 shows a first step in the fabrication of the fourth embodiment of the present invention.

The method of fabricating the structure shown in FIG. 22 will now be described. First of all, the structure shown in FIG. 2 is fabricated. To recover from the damage incurred at the edge portions of the gate oxide layer 20, the gate oxide layer 20 is subjected to thermal treatment. This forms the oxide insulation layer 40 on the main surface of the silicon substrate 10, the side surfaces of the gate oxide layer 20, the side surfaces of the gate electrode 26, and the upper surface of the gate electrode 26, as shown in FIG. 23. The conditions of this thermal treatment are a temperature of 600 to 900° C, a time of no more than 60 minutes, and an oxygen-rich environment comprising oxygen or water vapor.

Figure 24:
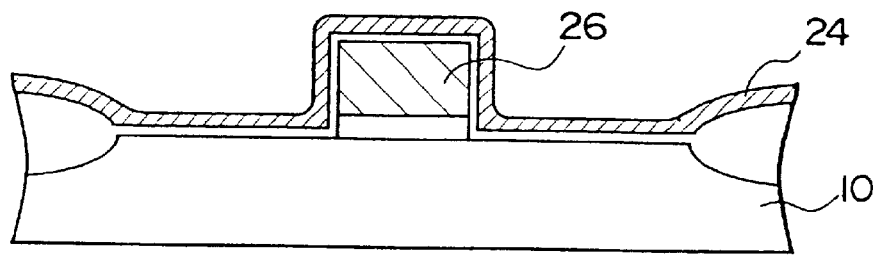
FIG. 24 shows a second step in the fabrication of the fourth embodiment of the present invention.

The silicon nitride layer 24 is then formed on the main surface of the silicon substrate 10 so as to cover the gate electrode 26, as shown in FIG. 24. The formation conditions thereof are the same as those of the step shown in FIG. 3.

Figure 25:
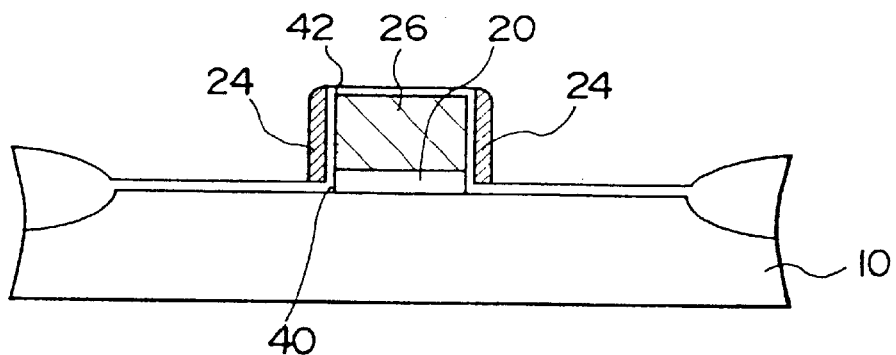
FIG. 25 shows a third step in the fabrication of the fourth embodiment of the present invention.

The silicon nitride layer 24 is etched back by using anisotropic etching, as shown in FIG. 25. This ensures that the silicon nitride layer 24 remains from a position corresponding to the corner portions 42 as far as a position corresponding to the side surfaces of the gate oxide layer 20. The silicon nitride layer 24 is positioned on top of the oxide insulation layer 40 which is positioned on top of the main surface of the silicon substrate 10. Thus the silicon nitride layer 24 is not formed so as to shield the entirety of each side surface of the gate oxide layer 20, but only part of each side surface. In this case too, it has a protective effect on the gate oxide layer 20. It should be noted, however, that the silicon nitride layer 24 would have a greater protective effect if it were to shield all of each side surface of the gate oxide layer 20. The conditions for etching the silicon nitride layer 24 are the same as those of the step shown in FIG. 4.

Figure 26:
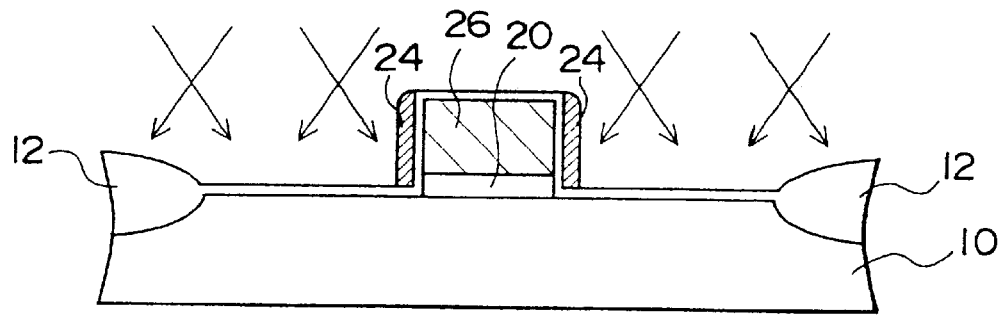
FIG. 26 shows a fourth step in the fabrication of the fourth embodiment of the present invention.

The gate electrode 26 and the field oxide layer 12 are used as a mask for the tilted ion implantation of an impurity into the main surface of the silicon substrate 10, as shown in FIG. 26. The conditions of the ion implantation are the same as those of the step shown in FIG. 11. The silicon nitride layer 24 is formed in such a manner that it shields the side surfaces of the gate oxide layer 20. Thus ions strike the silicon nitride layer 24, making it possible to prevent those ions from striking the side surfaces of the gate oxide layer 20. If an impurity is diffused into the main surface of the silicon substrate 10, instead of ion implantation, the silicon nitride layer 24 can still prevent the impurity from penetrating into the edge portions of the gate oxide layer 20.

Figure 27:
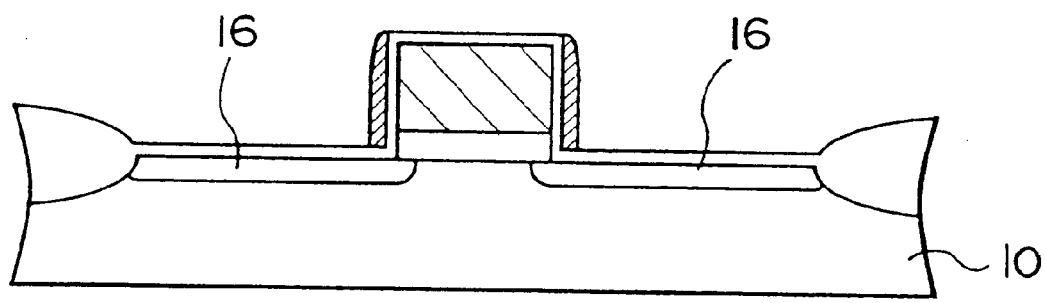
FIG. 27 shows a fifth step in the fabrication of the fourth embodiment of the present invention.

The silicon substrate 10 is subjected to thermal treatment to form the n$^-$-type regions 16, as shown in FIG. 27.

Figure 28:
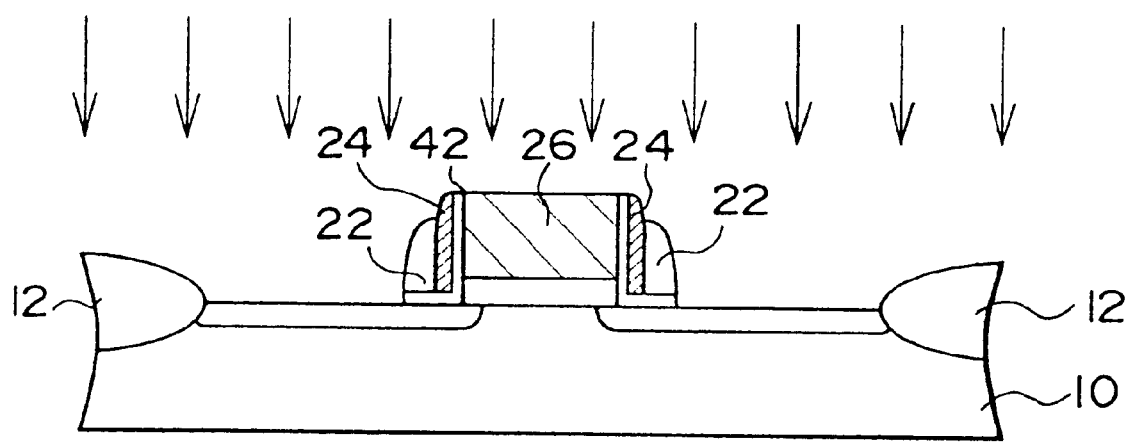
FIG. 28 shows a sixth step in the fabrication of the fourth embodiment of the present invention.

A method such as CVD is then used to form a silicon oxide layer over the entire main surface of the silicon substrate 10 so as to cover the gate electrode 26. Anisotropic etching is used to etch back the silicon oxide layer and thus form the side-wall silicon oxide layer 22 around the silicon nitride layer 24, as shown in FIG. 28. Since the side-wall silicon oxide layer 22 is over-etched, it is positioned lower than the corner portions 42. The gate electrode 26, the side-wall silicon oxide layer 22, and the field oxide layer 12 are then used as a mask for the implantation of ions of an impurity into the main surface of the silicon substrate 10. The conditions of the ion implantation are the same as those of the step described with reference to FIG. 14.

Figure 29:
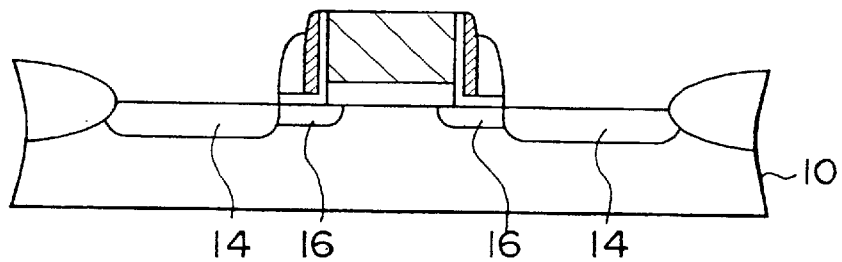
FIG. 29 shows a seventh step in the fabrication of the fourth embodiment of the present invention.

The ions implanted into the silicon substrate 10 are activated to form the n$^+$-type regions 14, as shown in FIG. 29.

Figure 30:
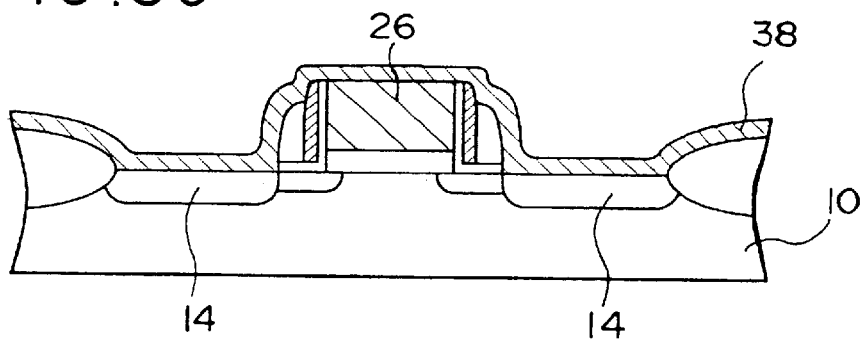
FIG. 30 shows an eighth step in the fabrication of the fourth embodiment of the present invention.

A method such as sputtering is used to form the titanium layer 38 so as to cover the gate electrode 26 and the n$^+$-type regions 14, as shown in FIG. 30.

Figure 31:
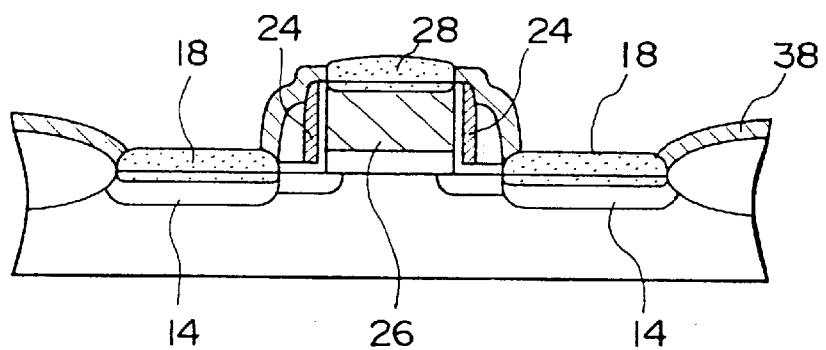
FIG. 31 shows a ninth step in the fabrication of the fourth embodiment of the present invention.

The titanium layer 38 is subjected to thermal treatment to form the titanium silicide layer 28 on the upper surface of the gate electrode 26 and the titanium silicide layers 18 on top of the n$^+$-type regions 14, as shown in FIG. 31. The crystalline structure of the titanium silicide layers 18 and 28 is C49. The silicon nitride layer 24 is positioned at the corner portions of the gate electrode 26. This ensures that the thickness of the edge portions of the titanium silicide layer 28 does not become greater than the thickness of the central portion thereof.

Figure 32:
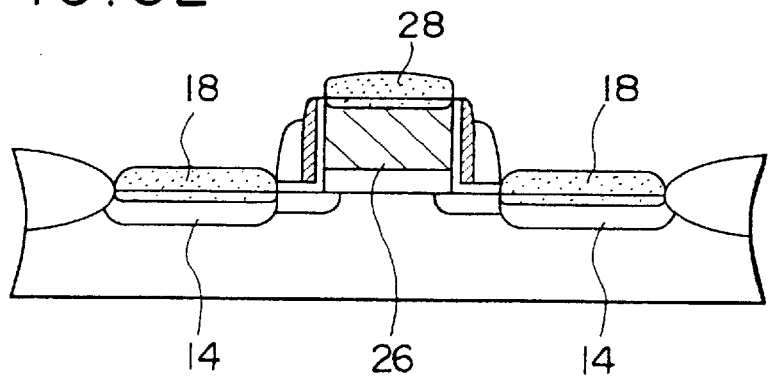
FIG. 32 shows a tenth step in the fabrication of the fourth embodiment of the present invention.

The unreacted parts of the titanium layer 38 are removed by using an ammonia type of substance, as shown in FIG. 32.

The titanium suicide layers 18 and 28 are then subjected to thermal treatment to change the crystalline structure of the titanium silicide layers 18 and 28 to C54.

Fifth Embodiment

Figure 33:
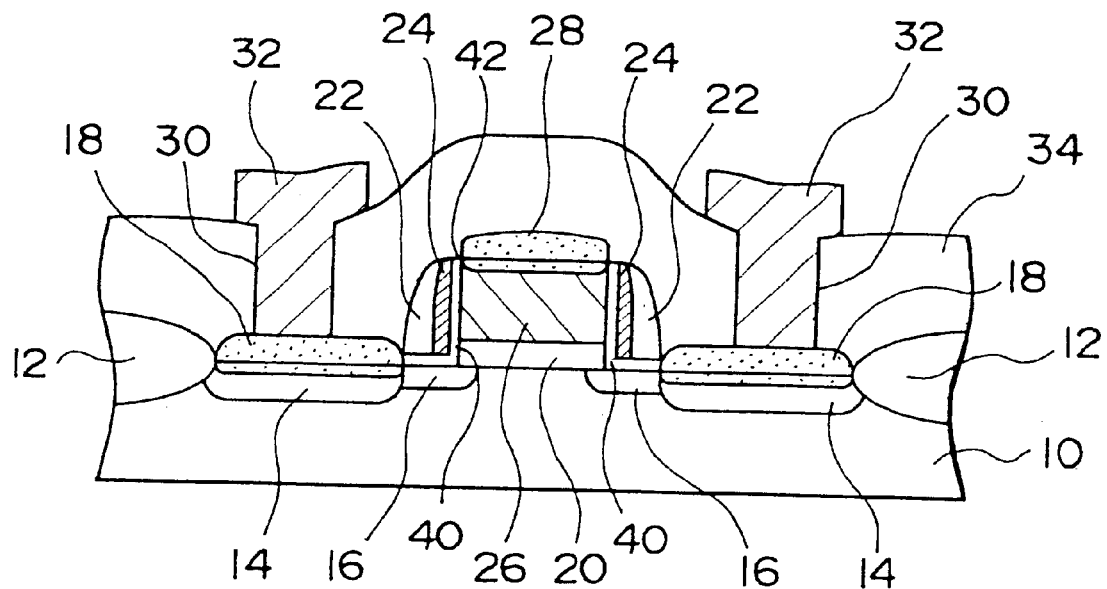
FIG. 33 is a cross-sectional view through a fifth embodiment of the present invention.

A cross-sectional view through a fifth embodiment of the present invention is shown in FIG. 33. The present embodiment differs from the fourth embodiment shown in FIG. 22 in that the side-wall silicon oxide layer 22 extends as far as a position corresponding to the corner portions 42. All other details are the same as those in the structure shown in FIG. 22, so the same reference numbers are used therefor and further description is omitted. The method of fabricating the structure shown in FIG. 33 is substantially the same as that of the fourth embodiment shown in FIGS. 22 to 32. The difference lies in the fact that the side-wall silicon oxide layer 22 is not over-etched. This ensures that the side-wall silicon oxide layer 22 extends as far as the position corresponding to the corner portions 42, as shown in FIG. 33.

Sixth Embodiment

Figure 34:
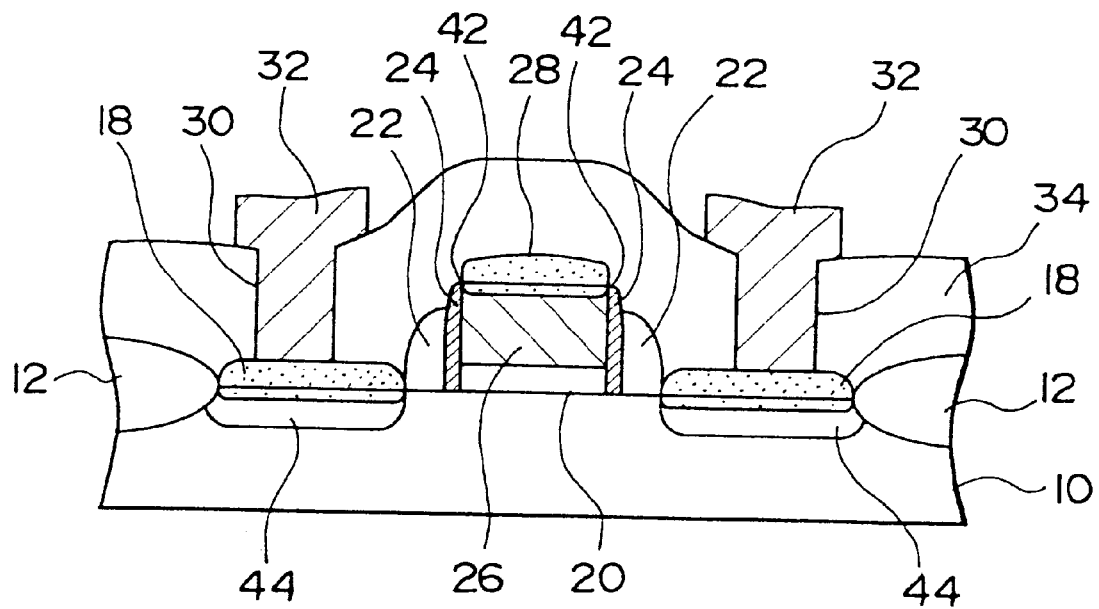
FIG. 34 is a cross-sectional view through a sixth embodiment of the present invention.

A cross-sectional view through a sixth embodiment of the present invention is shown in FIG. 34. The present embodiment differs from the first embodiment shown in FIG. 1 in that the source/drain 44 each have a single structure. All other details of the structure are the same as those of the first embodiment of FIG. 1, so the same reference numbers are used therefor and further description is omitted. The method of fabricating the structure shown in FIG. 34 is substantially the same as that of the first embodiment of the present invention, shown in FIGS. 1 to 10. The difference lies in the fact that no impurity is comprised within the side-wall silicon oxide layer 22. This means that the n$^-$-type regions 16 are not formed below the side-wall silicon oxide layer 22 when the silicon substrate 10 is subjected to thermal treatment in the step shown in FIG. 7.

Seventh Embodiment

Figure 35:
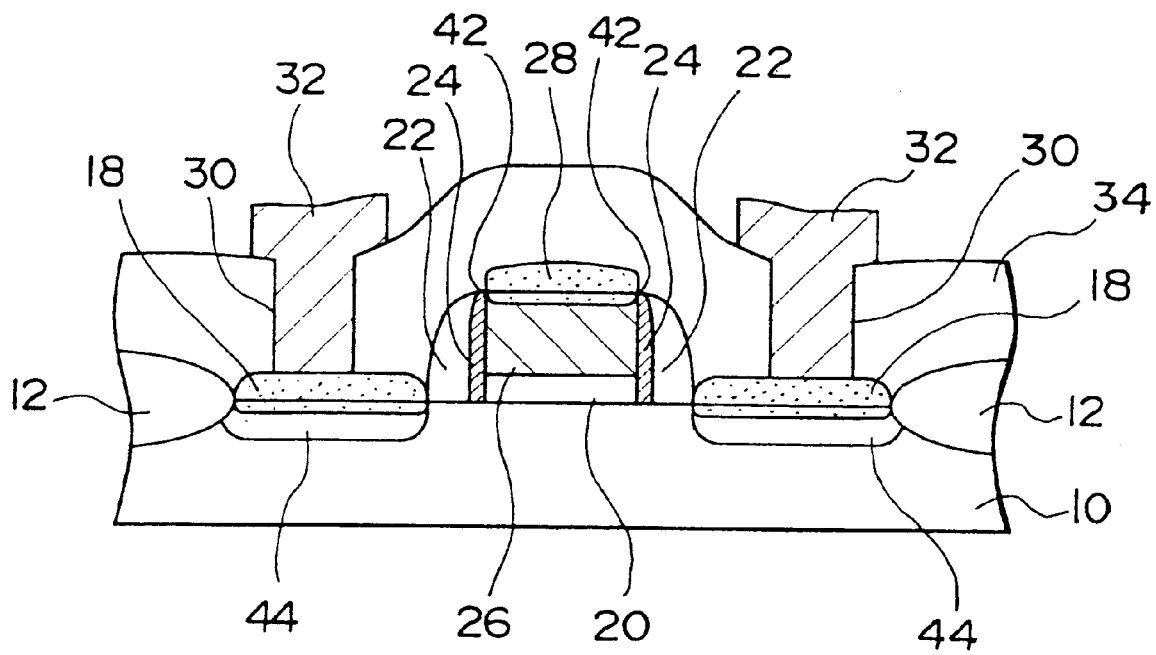
FIG. 35 is a cross-sectional view through a seventh embodiment of the present invention.

A cross-sectional view through a seventh embodiment of the present invention is shown in FIG. 35. The present embodiment differs from the third embodiment shown in FIG. 20 in that the source/drain 44 each have a single structure. All other details of the structure are the same as those of the third embodiment, so the same reference numbers are used therefor and further description is omitted.

The method of fabricating the structure shown in FIG. 35 is substantially the same as that of the third embodiment shown in FIGS. 16 to 20. The difference lies in the fact that no impurity is comprised within the side-wall silicon oxide layer 22. This means that no n$^-$-type region is formed by diffusion below the side-wall silicon oxide layer 22.

Eighth Embodiment

Figure 36:
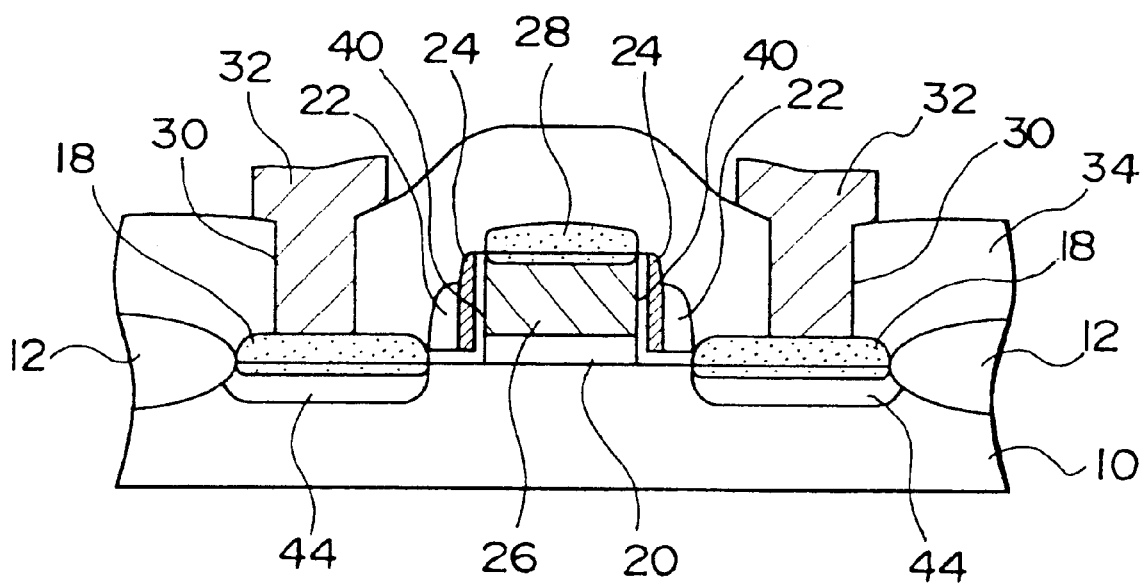
FIG. 36 is a cross-sectional view through an eighth embodiment of the present invention.

A cross-sectional view through an eighth embodiment of the present invention is shown in FIG. 36. The structure of the present embodiment is substantially the same as that of the fourth embodiment shown in FIG. 22. The difference lies in the single structure of the source/drain 44. All other details are the same as in the structure of the fourth embodiment, so the same reference numbers are used therefor and further description is omitted. The method of fabricating the structure shown in FIG. 36 is substantially the same as that for the structure shown in FIG. 22. The difference lies in the omission of the step of forming the n-type region, shown in FIGS. 26 and 27.

Ninth Embodiment

Figure 37:
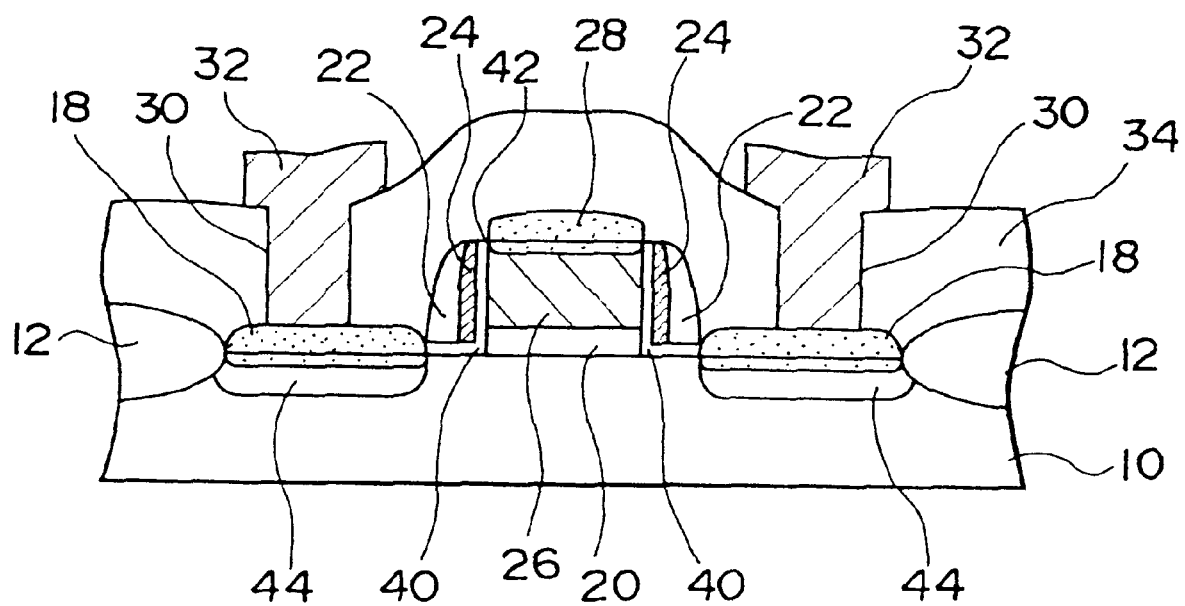
FIG. 37 is a cross-sectional view through a ninth embodiment of the present invention.

A cross-sectional view through a ninth embodiment of the present invention is shown in FIG. 37. The structure of the present embodiment is substantially the same as that of the fifth embodiment shown in FIG. 33. The difference lies in the single structure of the source/drain 44. All other details are the same as in the structure of the fifth embodiment, so the same reference numbers are used therefor and further description is omitted. The method of fabricating the structure shown in FIG. 37 is substantially the same as that for the structure shown in FIG. 33. The difference lies in the omission of the step of forming the n$^-$-type region, shown in FIGS. 26 and 27.

Tenth Embodiment

Figure 38:
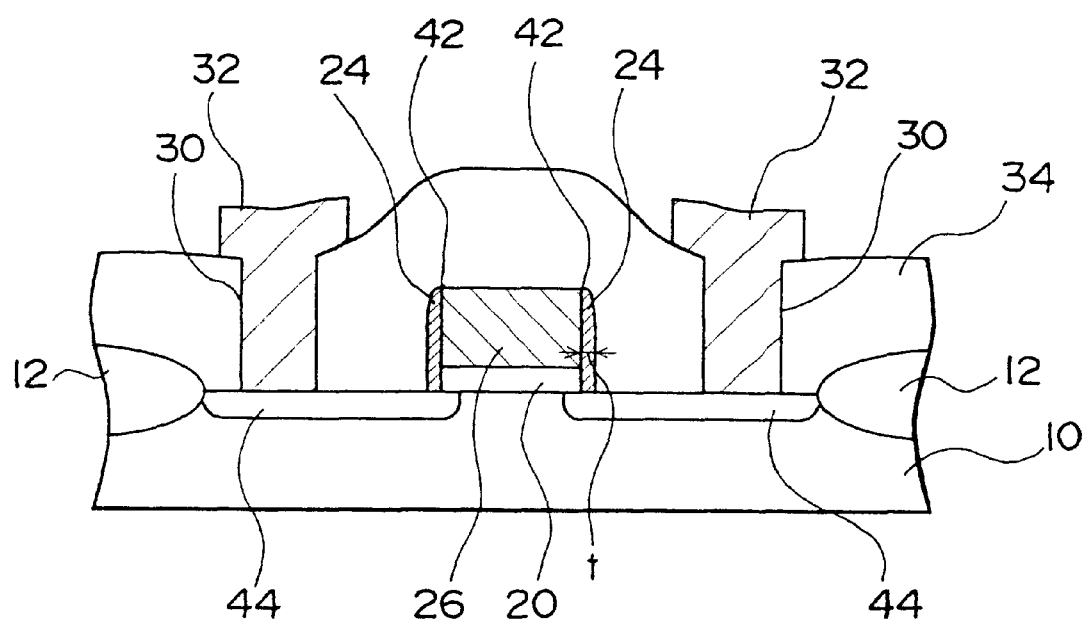
FIG. 38 is a cross-sectional view through a tenth embodiment of the present invention.

A cross-sectional view through a tenth embodiment of the present invention is shown in FIG. 38. The structure of the present embodiment differs from that of the sixth embodiment shown in FIG. 34 in that the titanium silicide layers 18 and 28 and the side-wall silicon oxide layer 22 are not formed, and the edge portions of the source/drain 44 are positioned to overlap the gate electrode 26. All other details are the same as in the structure of the sixth embodiment, so the same reference numbers are used therefor and further description is omitted. The thickness of the silicon nitride layer 24 is preferably at least 2 nm but less than 10 nm, as shown by the arrows t in the figure.

Eleventh Embodiment

Figure 39:
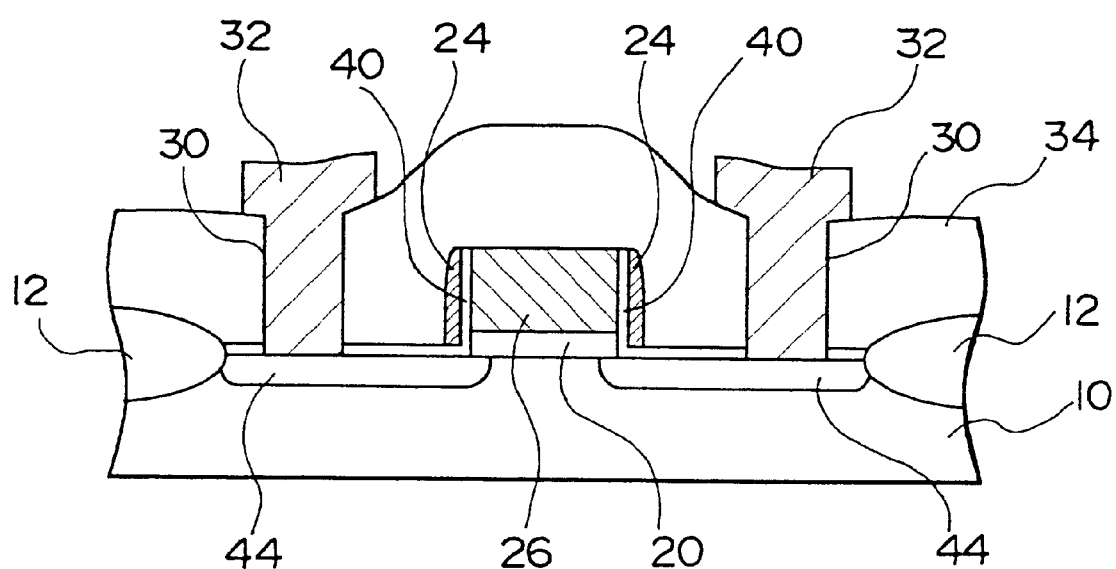
FIG. 39 is a cross-sectional view through an eleventh embodiment of the present invention.
Figure 40:
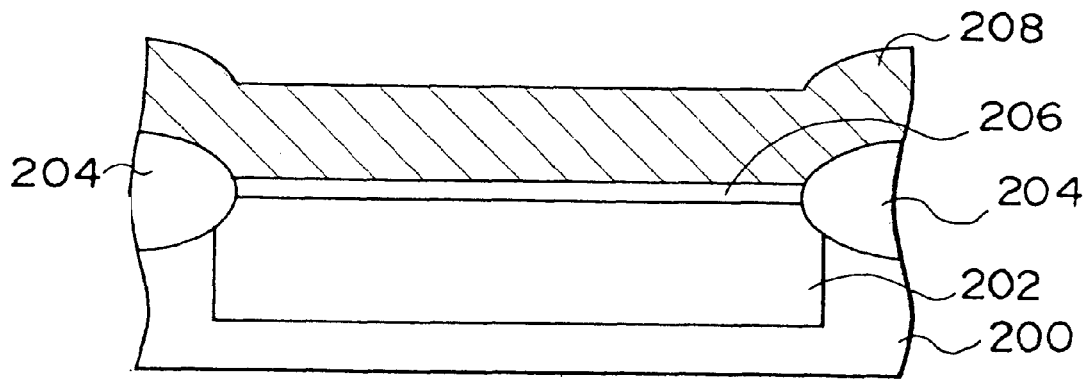
FIG. 40 shows a first step in the method of fabricating a prior-art MIS field-effect transistor.
Figure 41:
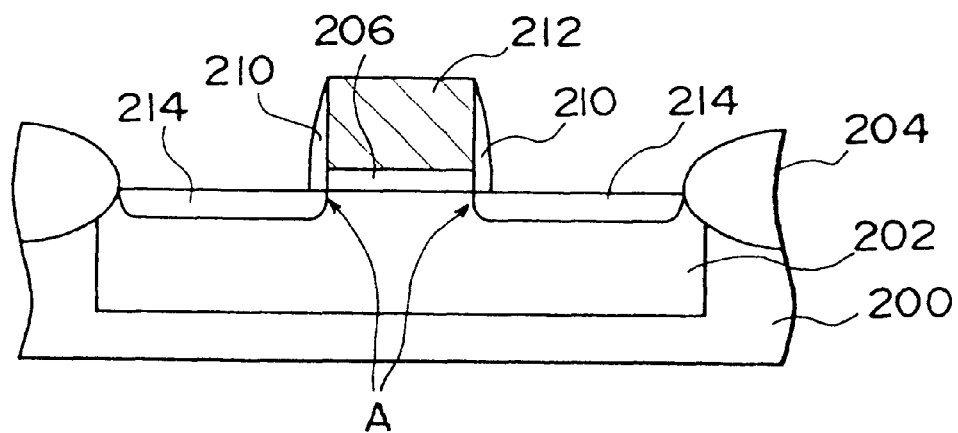
FIG. 41 shows a second step in the method of fabricating a prior-art MIS field-effect transistor.
Figure 42:
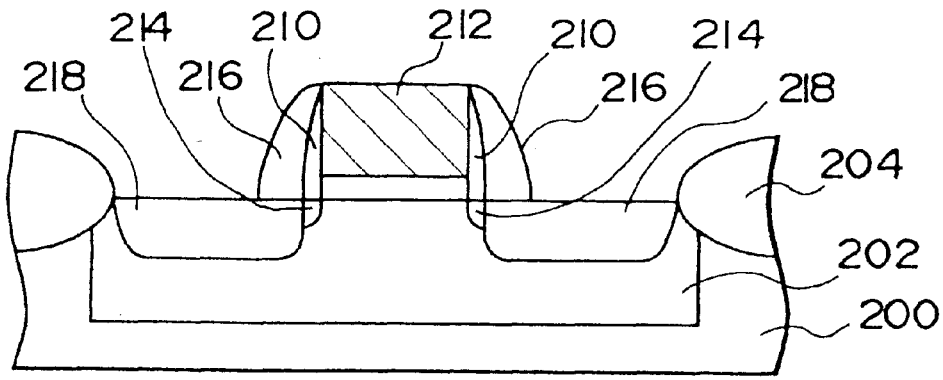
FIG. 42 shows a third step in the method of fabricating a prior-art MIS field-effect transistor.
Figure 43:
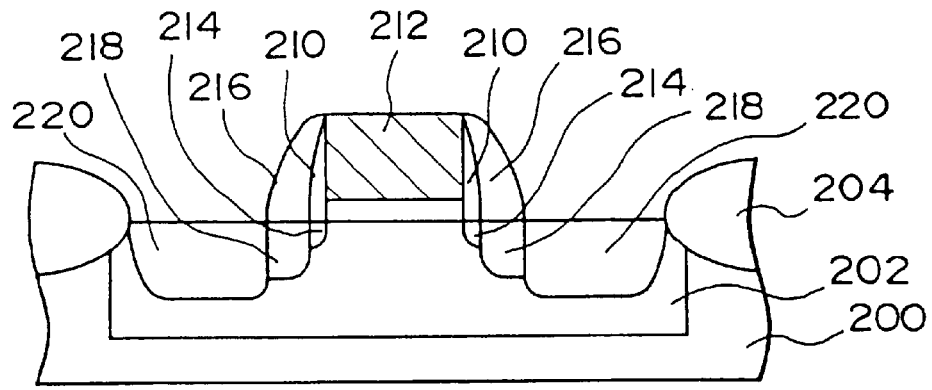
FIG. 43 shows a fourth step in the method of fabricating a prior-art MIS field-effect transistor.
Figure 44:
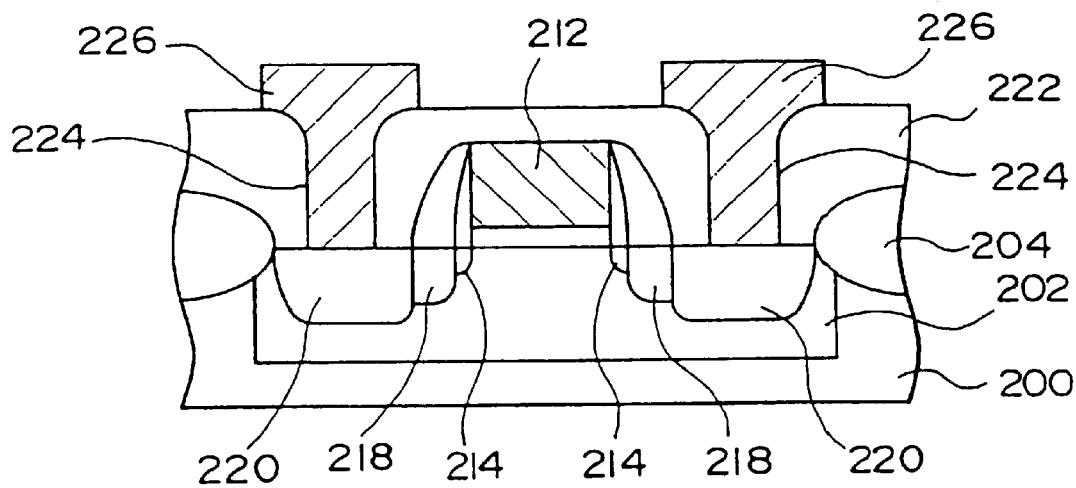
FIG. 44 shows a fifth step in the method of fabricating a prior-art MIS field-effect transistor.
Figure 45:
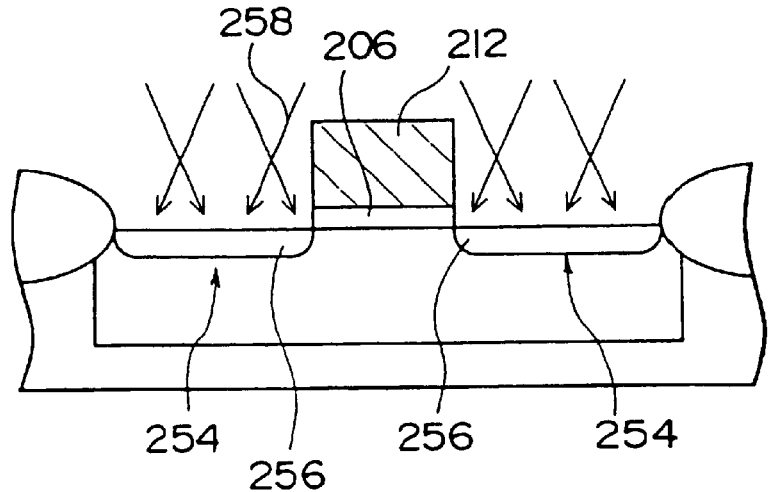
FIG. 45 is a cross-sectional view of a tilted ion implantation process.
Figure 46:
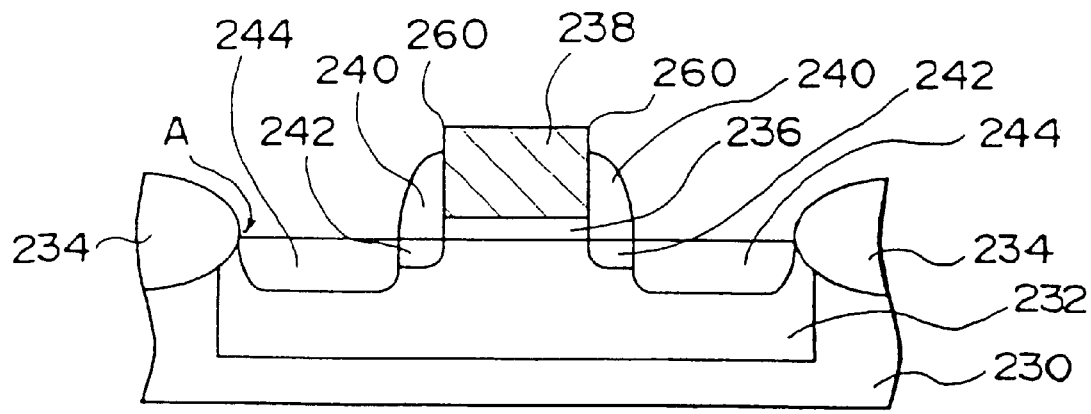
FIG. 46 shows a first step in an example of the method of fabricating a silicide structure.
Figure 47:
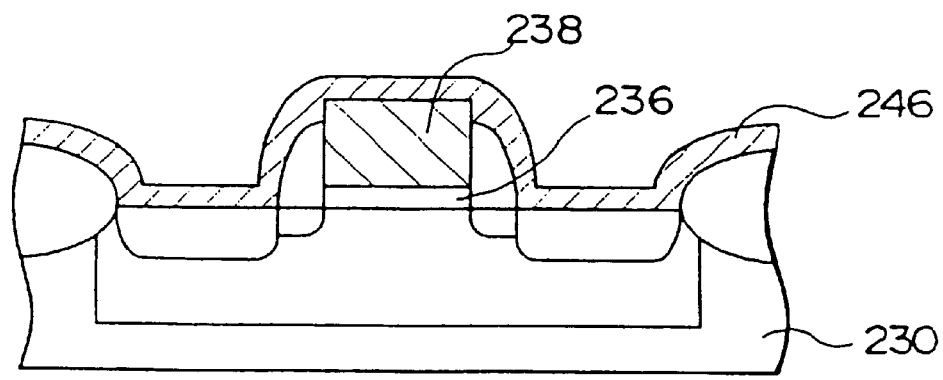
FIG. 47 shows a second step in this example of the method of fabricating a silicide structure.
Figure 48:
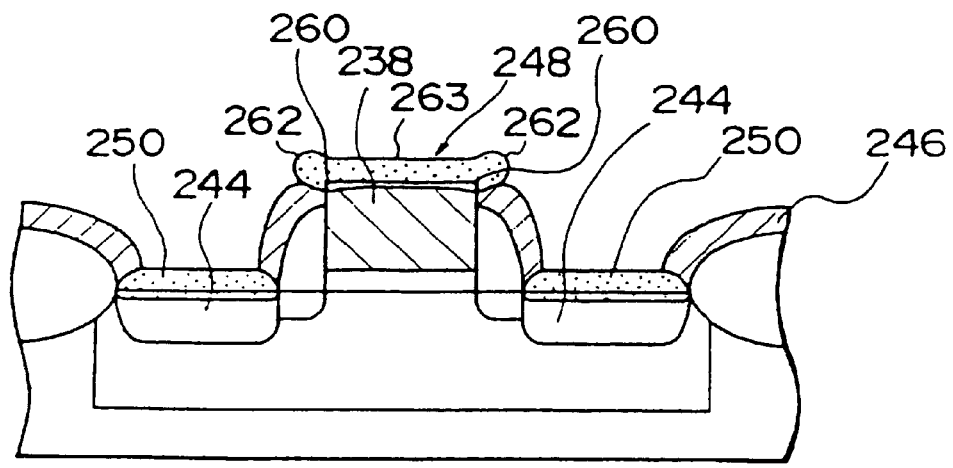
FIG. 48 shows a third step in this example of the method of fabricating a silicide structure.
Figure 49:
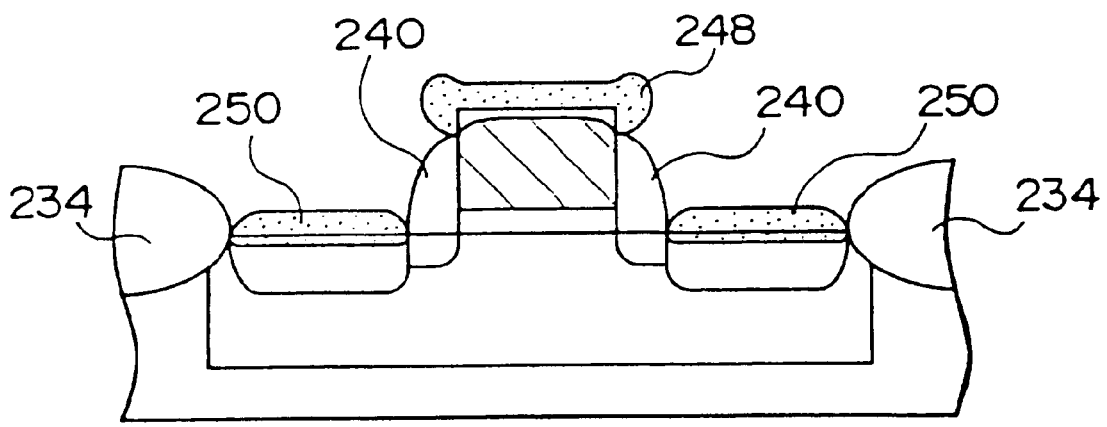
FIG. 49 shows a fourth step in this example of the method of fabricating a suicide structure.
Figure 50:
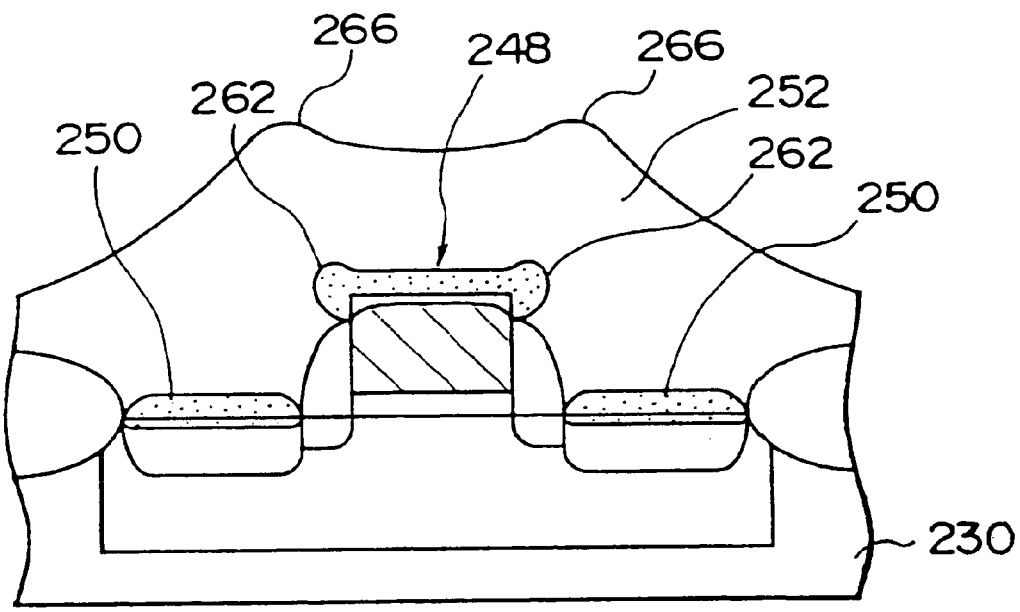
FIG. 50 shows a fifth step in this example of the method of fabricating a silicide structure.
Figure 51:
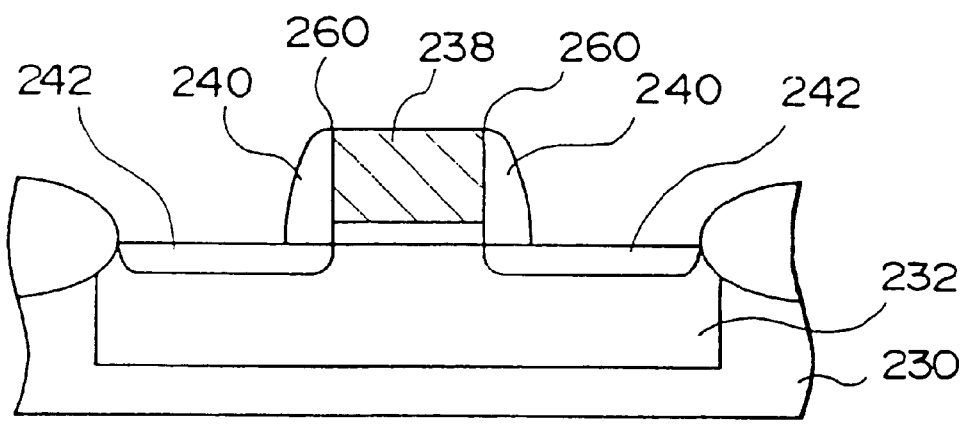
FIG. 51 shows a first step in another example of the method of fabricating a suicide structure.
Figure 52:
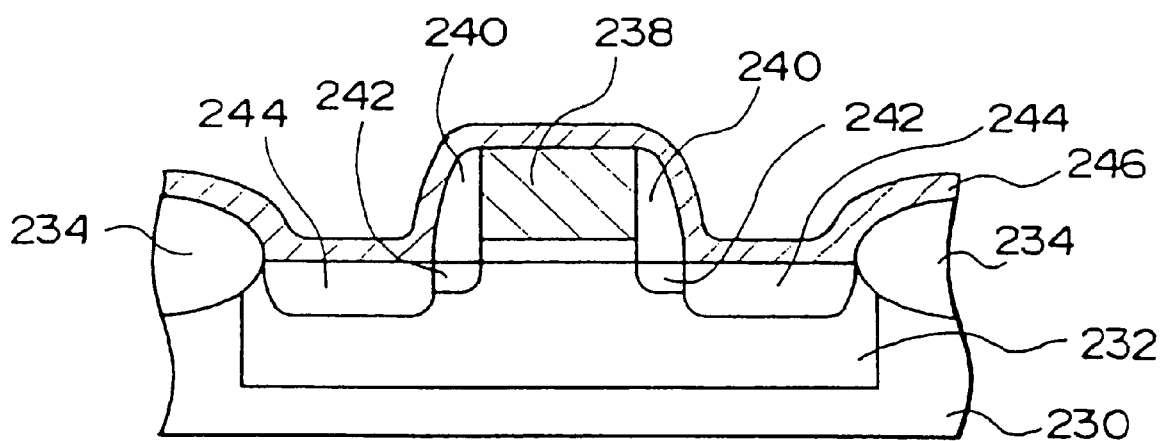
FIG. 52 shows a second step in this example of the method of fabricating a silicide structure.
Figure 53:
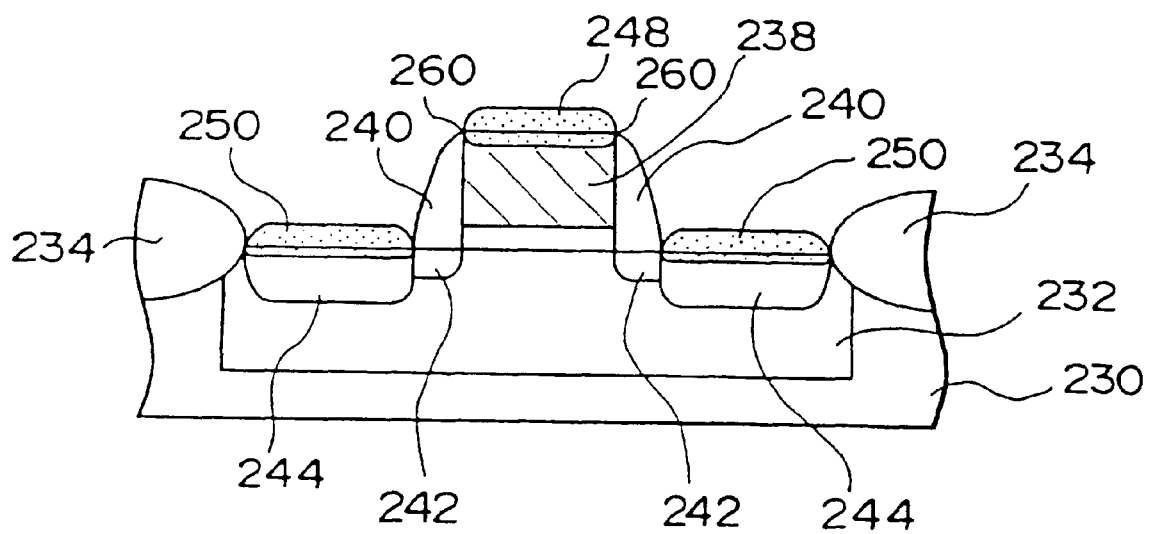
FIG. 53 shows a third step in this example of the method of fabricating a silicide structure.
Figure 54:
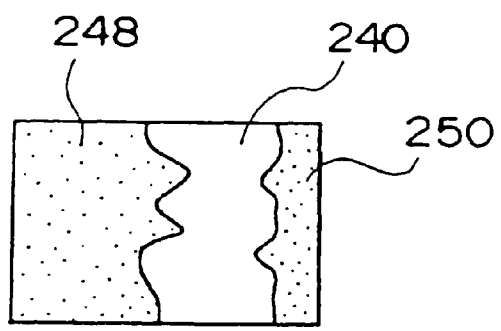
FIG. 54 is a partial plan view of the configuration shown in FIG. 53.

A cross-sectional view through an eleventh embodiment of the present invention is shown in FIG. 39. The structure of the eleventh embodiment differs from the structure of the eighth embodiment shown in FIG. 36 in that the titanium silicide layers 18 and 28 and the side-wall silicon oxide layer 22 are not formed, and the edge portions of the source/drain 44 are positioned to overlap the gate electrode 26. All other details are the same as in the structure of the eighth embodiment, so the same reference numbers are used therefor and further description is omitted.

What is claimed is:

1. A semiconductor device comprising a MIS field-effect transistor, said MIS field-effect transistor including:
    a semiconductor substrate having a main surface;
    a gate insulation layer formed on said main surface and having a side surface;
    a gate electrode formed on said gate insulation layer and having a corner portion between a side surface and an upper surface thereof;
    a pair of source/drain comprising a shallow-density impurity region and a high-density impurity region formed in said main surface;
    a protection layer for gate insulation layer comprising at least one of a silicon nitride film, a non-doped polysilicon film, and a non-doped amorphous silicon film, said protection layer for gate insulation layer being formed so as to shield said side surface of said gate insulation layer, a bottom surface of said protection layer for gate insulation layer being provided on an upper surface of said low-density impurity region, a portion of the upper surface of the low-density impurity region being formed closer to the high-density impurity region than the entire bottom surface of the protection layer for gate insulation layer;
    a side-wall insulation layer formed in such a manner that said protection layer for gate insulation layer is sandwiched between said side-wall insulation layer and said side surface of said gate electrode; and
    a silicide layer formed on said upper surface of said gate electrode.

2. The semiconductor device comprising a MIS field-effect transistor as defined in claim 1, wherein said protection layer for gate insulation layer is formed to extend from a position corresponding to said corner portion and over positions corresponding to said side surface of said gate insulation layer, so as to shield said side surface of said gate electrode and said side surface of said gate insulation layer.

3. The semiconductor device comprising a MIS field-effect transistor as defined in claim 2, wherein said side-wall insulation layer is formed so as to extend as far as a position corresponding to said corner portion.

4. The semiconductor device comprising a MIS field-effect transistor as defined in claim 2, wherein said side-wall insulation layer is formed to be positioned lower than said corner portion.

5. The semiconductor device comprising a MIS field-effect transistor as defined in claim 1, further comprising an oxide insulation layer positioned between said gate electrode and said protection layer for gate insulation layer and formed so as to cover said side surface of said gate electrode and said side surface of said gate insulation layer.

6. The semiconductor device comprising a MIS field-effect transistor as defined in claim 5, wherein
    said oxide insulation layer extends as far as on said pair of source/drain and the thickness of said oxide insulation layer is less than the thickness of said gate insulation layer; and
    said protection layer for gate insulation layer is positioned on said oxide insulation layer, which is on said pair of source/drain.

7. The semiconductor device comprising a MIS field-effect transistor as defined in claim 1, wherein said protection layer for gate insulation layer has a thickness that is greater than or equal to 2 nm but less than 10 nm.

8. The semiconductor device comprising a MIS field-effect transistor as defined in claim 4, wherein said pair of source/drain is provided with an edge portion such that said edge portion is at a position that overlaps said gate electrode.

9. A semiconductor device comprising a MIS field-effect transistor, said MIS field-effect transistor including:
    a semiconductor substrate having a main surface;
    a gate insulation layer formed on said main surface and having a side surface;
    a gate electrode formed on said gate insulation layer and having a corner portion between a side surface and an upper surface thereof;
    a pair of source/drain comprising a low-density impurity region and a high-density impurity region formed in said main surface; and
    a protection layer for gate insulation layer having a thickness that is greater than or equal to 2 nm but less than 10 nm, that is formed so as to shield said side surface of said gate insulation layer and comprises at least one of a silicon nitride film, a non-doped polysilicon film, and a non-doped amorphous silicon film, a bottom surface of said protection layer for gate insulation layer being provided on an upper surface of said low-density impurity region, a portion of the upper surface of the low-density impurity region being formed closer to the high-density impurity region than the entire bottom surface of the protection layer for gate insulation layer.

10. The semiconductor device comprising a MIS field-effect transistor as defined in claim 9, further comprising an oxide insulation layer positioned between said gate electrode and said protection layer for gate insulation layer and formed so as to cover said side surface of said gate electrode and said side surface of said gate insulation layer.

11. The semiconductor device comprising a MIS field-effect transistor as defined in claim 10, wherein:
    said oxide insulation layer extends as far as on said pair of source/drain and the thickness of said oxide insulation layer is less than the thickness of said gate insulation layer; and
    said protection layer for gate insulation layer is positioned on said oxide insulation layer, which is on said pair of source/drain.

12. The semiconductor device comprising a MIS field-effect transistor as defined in claim 9, further comprising a side-wall insulation layer formed in such a manner that said protection layer for gate insulation layer is sandwiched between said side-wall insulation layer and said side surface of said gate electrode.

13. The semiconductor device comprising a MIS field-effect transistor as defined in claim 12, wherein said protection layer for gate insulation layer is formed to extend from a position corresponding to said corner portion and over positions corresponding to said side surface of said gate insulation layer.

14. The semiconductor device comprising a MIS field-effect transistor as defined in claim 13, wherein said sidewall insulation layer is formed so as to extend as far as a position corresponding to said corner portion.

15. The semiconductor device comprising a MIS field-effect transistor as defined in claim 13, wherein said sidewall insulation layer is formed to be positioned lower than said corner portion.

16. The semiconductor device comprising a MIS field-effect transistor as defined in claim 14, said MIS field-effect transistor including a silicide layer formed on said upper surface of said gate electrode.

17. The semiconductor device comprising a MIS field-effect transistor as defined in claim 15, said MIS field-effect transistor including a silicide layer formed on said upper surface of said gate electrode.

18. The semiconductor device comprising a MIS field-effect transistor as defined in claim 9, wherein said pair of source/drain is provided with an edge portion such that said edge portion is at a position that overlaps said gate electrode.

* * * * *